United States Patent
Tobita

[11] Patent Number: 5,900,665
[45] Date of Patent: May 4, 1999

[54] SEMICONDUCTOR INTEGRATED CIRCUIT DEVICE OPERATING AT HIGH SPEED WITH LOW CURRENT CONSUMPTION

[75] Inventor: Youichi Tobita, Hyogo, Japan

[73] Assignee: Mitsubishi Denki Kabushiki Kaisha, Tokyo, Japan

[21] Appl. No.: 08/938,605

[22] Filed: Sep. 26, 1997

[30] Foreign Application Priority Data

Apr. 1, 1997 [JP] Japan .................................. 9-082710

[51] Int. Cl.$^6$ .................................................. H01L 29/72
[52] U.S. Cl. ...................... 257/357; 257/339; 257/356; 257/371; 257/393; 257/487
[58] Field of Search ..................................... 257/339, 356, 257/357, 371, 393, 487

[56] References Cited

U.S. PATENT DOCUMENTS 5,461,338   10/1995   Hirayama et al. .

FOREIGN PATENT DOCUMENTS 6-21443    1/1994   Japan .
8-017183   1/1996   Japan .
8-17183    1/1996   Japan .
8-186180   7/1996   Japan .

OTHER PUBLICATIONS

Advanced Electronics Series I–9, "VLSI Memory" by K.Itoh, Baifukan Shuppan, published on Nov. 5, 1994, pp.351–353.
"Reducing a Standby Power to a Conventional Device . . . ", T. Kuroda et al., Niddei Microdevices, Mar. 1995, pp.58–60.

Primary Examiner—Edward Wojciechowicz
Attorney, Agent, or Firm—McDermott, Will & Emery

[57] ABSTRACT

A substrate region of an n-channel MOS transistor is supplied with a bias voltage (VNBL) lower than a ground voltage (Vss) in a standby cycle, and with a bias voltage (VNBH) higher than the ground voltage in an active cycle. The difference between an internal power supply voltage (intVcc) and the bias voltage (VNBL) is at the level of a driving voltage (VPP) transmitted to a selected word line, while the arithmetic mean of the bias voltages (VNBL, VNBH) is substantially at the level of the ground voltage. A back gate voltage can be generated by a MOS transistor having gate insulating film breakdown voltage of the same degree as that of a memory cell transistor. Reliability of the gate insulating film of the MOS transistor of a back gate voltage generation circuit is improved, and the back gate voltage is readily generated on-chip.

20 Claims, 14 Drawing Sheets

FIG. 7
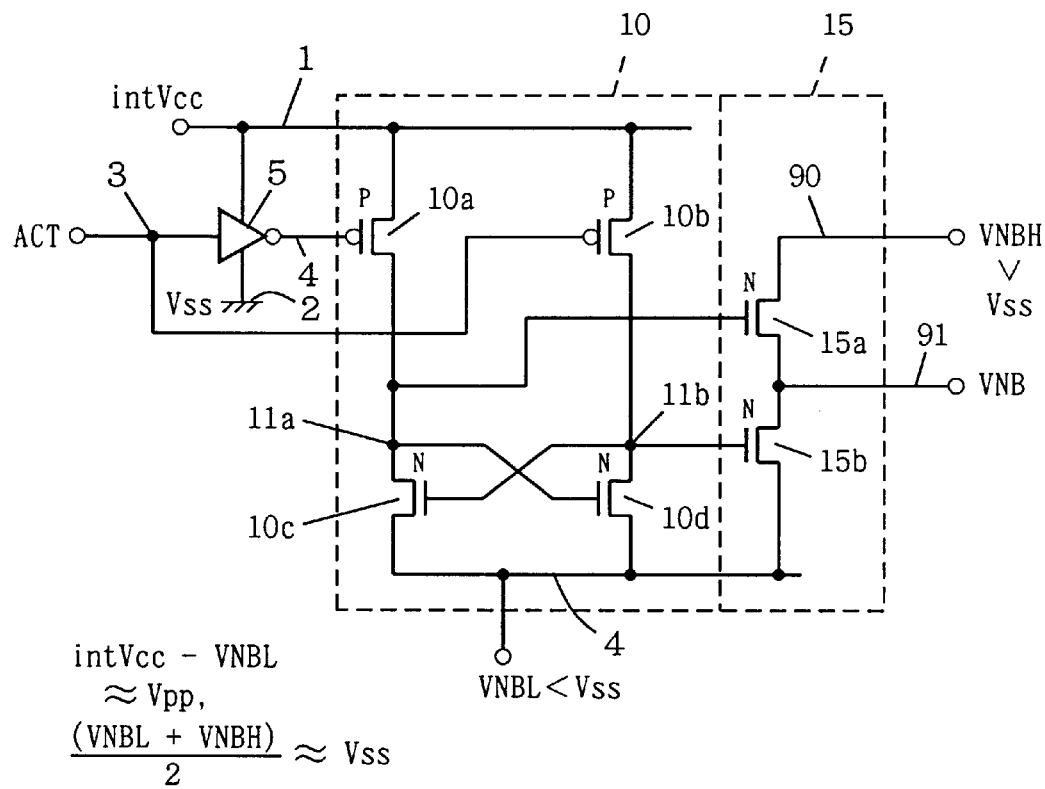
$intVcc - VNBL \approx Vpp,$
$\frac{(VNBL + VNBH)}{2} \approx Vss$
FIG. 8A  FIG. 8B  FIG. 8C
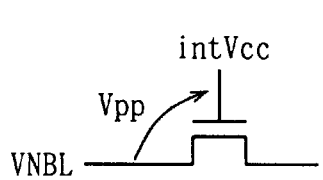 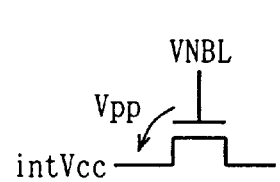 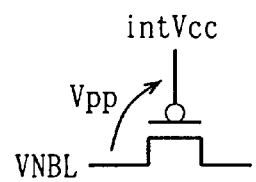
FIG. 9
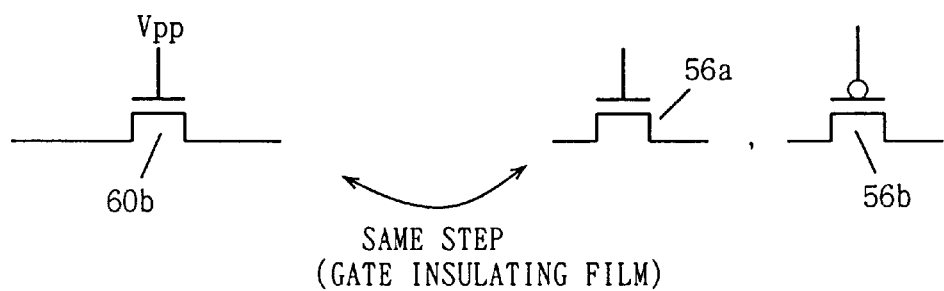
SAME STEP
(GATE INSULATING FILM)

FIG. 10A  FIG. 10B  FIG. 10C
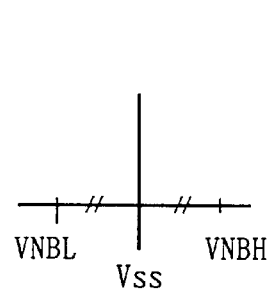
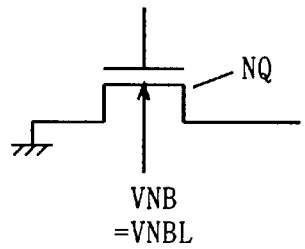
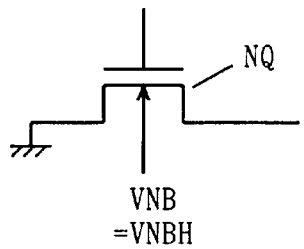
FIG. 11
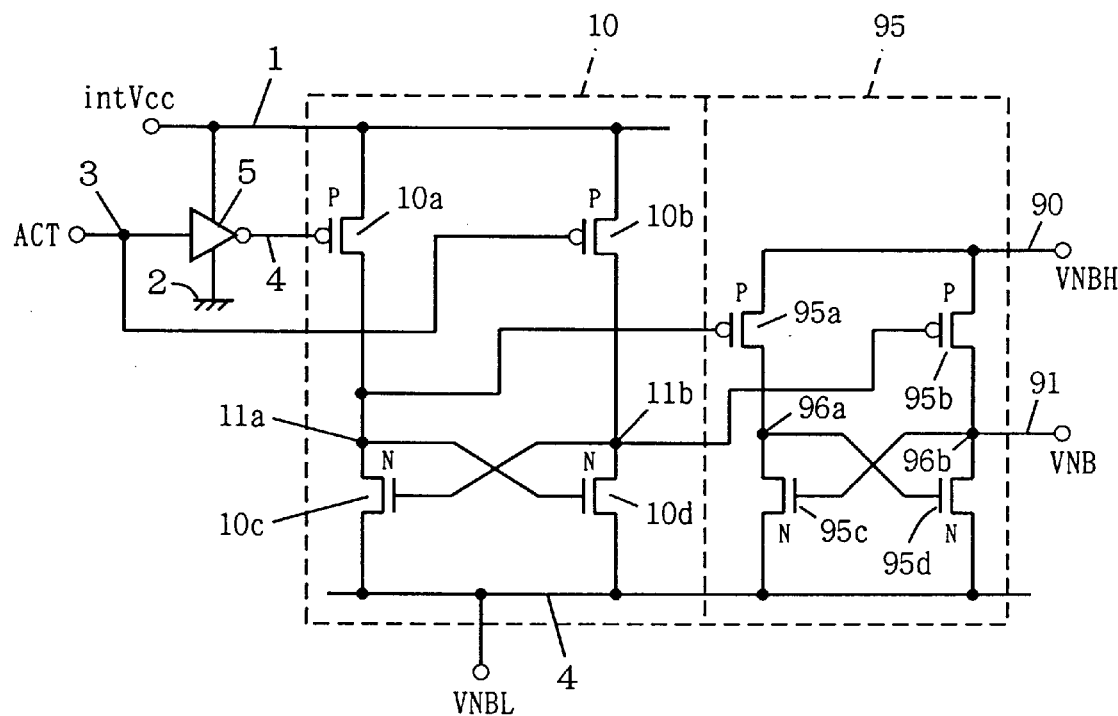
FIG. 12
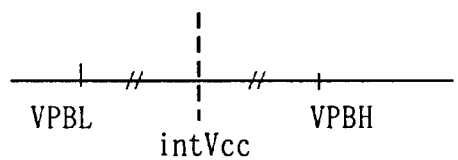

$VPBH - Vss \approx Vpp$, $\dfrac{(VPBL + VPBH)}{2} \approx intVcc$

SEMICONDUCTOR INTEGRATED CIRCUIT DEVICE OPERATING AT HIGH SPEED WITH LOW CURRENT CONSUMPTION

BACKGROUND OF THE INVENTION

1. Field of the Invention

The present invention relates to a semiconductor integrated circuit device, and more particularly, it relates to a structure for implementing a high-speed operation and low power consumption in a semiconductor integrated circuit device including MOS transistors (insulated gate field effect transistors) as its components.

2. Description of the Background Art

Following densification of a semiconductor integrated circuit device such as logic and a memory circuit, elements are refined and it is necessary to reduce the power supply voltage in order to insure the breakdown voltage of these elements. If the semiconductor integrated circuit device is composed of MOS transistors, however, the driving speed for signal lines varies with the gate potentials of these MOS transistors (a so-called square characteristics of a drain current), and hence the operating speed of the circuit is reduced. In order to avoid such reduction of the operating speed, the absolute value of the threshold voltage Vth of each MOS transistor must be reduced. A value Vgs–Vth is increased to increase the drain current, where Vgs represents the gate-to-source voltage. Due to the reduction of the absolute value of the threshold voltage Vth, the MOS. transistor enters a conducting state at a fast timing for supplying the drain current, and high-speed charging/discharging of the signal line is implemented.

In general, the relation between the power supply voltage Vcc and the threshold voltage Vth with priority to the operating speed is expressed as follows, as shown in Advanced Electronics Series I-9, "VLSI Memory" by Itoh, Baifukan Shuppan, published on Nov. 5, 1994, p. 352, for example:

$$Vth = \alpha \cdot Vcc$$

where α represents a constant which takes a value of 0.1 to 0.2. Assuming that the power supply voltage Vcc is 1 V, for example, the threshold voltage Vth is 0.1 to 0.2 V.

With priority to power consumption in a standby state, on the other hand, a subthreshold current must be taken into consideration. This subthreshold current is defined by a gate-to-source voltage in such a state that a constant drain current I0 starts to flow through a MOS transistor having a certain channel width (W0). This subthreshold current flows even if the gate-to-source voltage Vgs is 0 V. According to Kuroda et al., the subthreshold current as well as standby power are increased when the threshold voltage is reduced to no more than about 0.4 V (refer to Nikkei Microdevices, March 1995, p. 58).

FIG. 27 schematically illustrates changes of threshold voltages Vth of n-channel MOS transistors with respect to a potential difference VBS between a back gate (substrate regions) and a source. Referring to FIG. 27, curves T1 and T2 show threshold voltages Vth of n-channel MOS transistors, which are at the levels of 0.1 V and 0.28 V when the back gate-to-source potential differences VBS are 0 V respectively. Referring to FIG. 27, the axis of ordinates measures the threshold voltages VTh, and the axis of abscissas measures the back gate-to-source potential differences VBS. Each of these curves T1 and T2 is obtained in accordance with the following equation (1), on the assumption that a substrate effect constant K described later is 0.4:

$$Vth = VTH0 + |K|[(2 \cdot \Phi F - VBS|)^{1/2} - (|2 \cdot \phi F|)^{1/2}] \qquad (1)$$

where VBS represents the back gate potential (back gate-to-source voltage) with reference to the source potential, K represents the substrate effect constant, ΦF represents the substrate surface potential, and VTH0 represents the threshold voltage obtained when the back gate-to-source potential difference VBS is 0 V.

As clearly understood from the characteristic curve T1 shown in FIG. 27, the threshold voltage Vth is increased when the back gate potential with reference to the source potential, i.e., the back gate-to-source voltage VBS is increased in the negative direction in the n-channel MOS transistor. For example, it is assumed that an n-channel MOS transistor having a threshold voltage Vth0 when the back gate-to-source voltage VBS is 0 V is formed by controlling the amount of implanted ions into the gate region of the n-channel MOS transistor (characteristic curve T1). In order to increase the threshold voltage Vth of this n-channel MOS transistor to 0.4 V, the back gate-to-source voltage VBS must be reduced to –1.71 V, from this characteristic curve T1. In other words, the threshold voltage of the n-channel MOS transistor can be changed by controlling the back gate-to-source voltage VBS.

FIG. 28 schematically illustrates the relations between gate potentials Vgs of n-channel MOS transistors with reference to source potentials and drain currents Ids. Referring to FIG. 27, the axis of abscissas measures the gate potentials (hereinafter referred to as gate voltages) with reference to the source potentials, and the axis of ordinates measures the drain currents in logarithmic scale. Characteristic curves TS1 and TS2 show drain currents flowing when the back gate-to-source voltages VBS are 0 V and –1.71 V respectively. Referring to the characteristic curves TS1 and TS2 shown in FIG. 28, substantially linear regions are called subthreshold regions.

Comparing the characteristic curves TS1 and TS2 with each other, it is clearly understood that the subthreshold current (drain current) flowing when the back gate-to-source voltage VBS is 0 V is larger than that flowing when the back gate-to-source voltage VBS is –1.71 V. When the back gate-to-source voltage VBS is 0 V, even when the gate voltage Vgs is low, a relatively large current flows due to reduction of the threshold voltage by 0.3 V. If an n-channel MOS transistor with the characteristic curves TS1 and TS2 in an active period, i.e., in a circuit operation and in a standby cycle respectively is employed, implemented is an n-channel MOS transistor operating at a high speed with a subthreshold current sufficiently suppressed in a standby state.

FIG. 29 illustrates an exemplary structure of a conventional back gate voltage switching circuit for an n-channel MOS transistor. Referring to FIG. 29, the back gate voltage switching circuit includes an invertor 5 operating with a power supply voltage Vcc on a power supply line 1 and a ground voltage Vss on a ground line 2 as operating power supply voltages, for inverting an activation signal SNB supplied on an input signal line 3 and outputting the inverted signal onto an output signal line 4, a level conversion circuit 10 converting the voltage level of the signal supplied from the invertor 5 onto the output signal line 4 to the level of the power supply voltage Vcc or a negative voltage VNBL, and a back gate driving circuit 15 outputting either the ground voltage Vss or the negative voltage VNBL in accordance with an output signal of the level conversion circuit 10.

A back gate voltage VNB from the back gate driving circuit 15 is supplied to a back gate (substrate region) of an n-channel MOS transistor Q included in an internal circuit 18 through an output signal line 16. The activation signal SNB indicates activation/inactivation of the internal circuit 18, and the internal circuit 18 operates when the activation signal SNB is at a high level, while remaining in an inactive state and holding a standby state when the signal SNB is at a low level.

The level conversion circuit 10 includes a p-channel MOS transistor 10a which conducts in response to the signal on the output signal line 4 for transmitting the power supply voltage Vcc on the power supply line 1 to an internal node 11a, a p-channel MOS transistor 10b which conducts in response to the activation signal SNB for transmitting the power supply voltage Vcc on the power supply line 1 to an internal node 11b, an n-channel MOS transistor 10c which conducts in response to the signal potential on the internal node 11b for transmitting a low-level back gate voltage VNBL on a back gate voltage supply line 14 to the internal node 11a, and an n-channel MOS transistor 10d which conducts in response to the signal potential on the internal node 11a for transmitting the low-level back gate voltage VNBL to the internal node 11b.

The back gate driving circuit 15 includes an n-channel MOS transistor 15a which conducts in response to the signal potential on the internal node 11a for transmitting the voltage Vss on a high-level back gate voltage supply line 17 to the output signal line 16, and an n-channel MOS transistor 15b which conducts in response to the signal potential on the internal node 11b for transmitting the low-level back gate voltage VNBL to the output signal line 16. The high-level back gate voltage supply line 17, which transmits a high-level back gate voltage, i.e., the ground voltage Vss, is equivalent to a ground line. The ground voltage Vss is 0 V, and the low-level back gate voltage VNBL is −1.71 V, for example. The term"back gate voltage" indicates a voltage measured with reference to the ground voltage. The operation of the back gate voltage switching circuit shown in FIG. 29 is now briefly described.

When the internal circuit 18 is in an inactive and standby state, the activation signal SNB is at a low level, and the signal outputted from the invertor 5 to the output signal line 4 goes high to the level of the power supply voltage Vcc. In this state, the p-channel MOS transistors 10a and 10b enter non-conducting and conducting states respectively, and the internal node 11b is charged by the p-channel MOS transistor 10b. In accordance with the potential increase of the internal node 11b, the n-channel MOS transistor 10c conducts to reduce the potential of the internal node 11a to the level of the negative back gate voltage VNBL. Following the potential reduction of the internal node 11a, the n-channel MOS transistor 10d enters a non-conducting state. Thus, the internal node 11b is charged to the level of the power supply voltage Vcc by the p-channel MOS transistor 10b, while the internal node 11a is discharged to the level of the negative back gate voltage VNBL.

The level of the negative back gate voltage VNBL is lower than the ground voltage Vss, and the n-channel MOS transistor 15a enters a non-conducting state, while the n-channel MOS transistor 15b receiving the power supply voltage Vcc at its gate conducts to transmit the low-level negative back gate voltage VNBL to the back gate of the n-channel MOS transistor Q included in the internal circuit 18 as the back gate voltage VNB. In the standby state of the internal circuit 18, therefore, the threshold voltage of the n-channel MOS transistor Q is increased to suppress a subthreshold current.

When the internal circuit 18 operates in an active cycle, on the other hand, the activation signal SNB goes high and the signal outputted from the invertor 5 onto the output signal line 4 is brought to the level of the ground voltage Vss. Thus, the p-channel MOS transistors 10a and 10b enter conducting and non-conducting states respectively. In this state, the n-channel MOS transistors 10c and 10d enter non-conducting and conducting states respectively contrarily to the aforementioned standby cycle, and the voltages of the internal nodes 11a and 11b are brought to the levels of the power supply voltage Vcc and the negative back gate voltage VNBL respectively. Therefore, the n-channel MOS transistors 15b and 15a enter non-conducting and conducting states, and the ground voltage Vss is supplied as the back gate voltage VNB. Thus, the threshold voltage of the n-channel MOS transistor Q of the internal circuit 18 is reduced so that the n-channel MOS transistor Q performs a switching operation at a high speed.

Also as to a back gate voltage for a p-channel MOS transistor included in the internal circuit 18, a similar effect can be attained by replacing the back gate voltage VNB for the n-channel MOS transistor Q with a voltage at the level of the power supply voltage Vcc or a higher level. As to the relation between the threshold voltage and the back gate-to-source voltage of the p-channel MOS transistor, the sign of the back gate-to-source voltage VBS may be inverted in each characteristic curve shown in FIG. 27, while subthreshold current characteristics of the p-channel MOS transistor can be obtained by inverting the sign of each gate voltage vgs shown in FIG. 28.

As hereinabove described, a high-speed operation in an active cycle and low power consumption in a standby cycle can be implemented by switching the back gate voltage for each MOS transistor depending on the operating cycle. However, the level conversion circuit 10, which is employed for switching the back gate voltage, changes the level of the signal changing between the power supply voltage Vcc and the ground voltage Vss to the level of the power supply voltage Vcc or the negative back gate voltage VNBL. In this case, the power supply voltage Vcc is applied to the gate of the n-channel MOS transistor 15b included in the back gate driving circuit 15 in the standby cycle of the internal circuit 18 with the activation signal SNB at a low level. Assuming that the power supply voltage is 1.0 V, the gate-to-source voltage of the n-channel MOS transistor 15n is Vcc−VNBL= 1.0−(−1.71)=2.71 V, and it follows that a large voltage of 2.71 times the gate-to-source voltage (1.0 V) of an n-channel MOS transistor included in the invertor 5 is applied, for example.

Also in the level conversion circuit 10, the voltage of 2.71 V is applied between the gate and the drain of each of the non-conductive p-channel MOS transistors 10a and 10b while a voltage of 2.71 V is similarly applied between the gate and the source of each of conductive the n-channel MOS transistors 10c and 10d. Consequently, large electric fields are applied across respective insulating films of gate electrode parts of these MOS transistors, to disadvantageously reduce the reliability of the insulating films.

FIG. 30 illustrates another exemplary conventional back gate voltage switching circuit, which is shown in Nikkei Microdevices, March 1995, p. 59, for example. The back gate voltage switching circuit shown in FIG. 30 applies a back gate voltage VNB to a back gate of an n-channel MOS transistor.

Referring to FIG. 30, the back gate voltage switching circuit includes a p-channel MOS transistor 22 which is connected between a power supply line 20 transmitting a power supply voltage Vcc and an internal node 21 for receiving an activation signal /CE at its gate, a p-channel MOS transistor 24 which is connected between the internal node 21 and an internal node 23 and has a gate connected to a ground line 25 transmitting a ground voltage Vss, diodes 26a and 26b serially connected between the internal node 23 and an internal node 24, and an n-channel MOS transistor 28 which is connected between the internal node 24 and a back gate voltage transmission line 27 transmitting a low-level back gate voltage VNBL and has a gate connected to the ground line 25. The back gates of the MOS transistors 22 and 24 are connected to the power supply line 20, while that of the MOS transistor 28 is connected to the low-level back gate voltage transmission line 27.

The back gate voltage switching circuit further includes a p-channel MOS transistor 29a and an n-channel MOS transistor 29b forming an invertor which operates with the ground voltage Vss on the ground line 25 and the low-level back gate voltage VNBL on the low-level back gate voltage transmission line 27 as operating power supply voltages for inverting a signal on the internal node 24, and a p-channel MOS transistor 31a and an n-channel MOS transistor 31b forming an invertor for inverting an output signal transmitted from the invertor (the MOS transistors 29a and 29b) onto an internal node 30 and outputting a back gate voltage VNB onto a signal line 32. Back gates of the p-channel MOS transistors 29a and 31a are connected to the power supply line 20, and those of the n-channel MOS transistors 29b and 31b are connected to the low-level back gate voltage transmission line 27. The operation is now briefly described.

The MOS transistors 24 and 28 receive the ground voltage Vss at the gates thereof, and operate as resistive elements. The power supply voltage Vcc is equalized in absolute value with the low-level back gate voltage VNBL. The power supply voltage Vcc is 2.0 V, for example, and the low-level back gate voltage VNBL is −2.0 V.

When the activation signal /CE is at a high level and an internal circuit is an inactive and standby state, the MOS transistor 22 is in a non-conducting state and the node 24 is held at the level of the low-level back gate voltage VNBL by the MOS transistor 28. In response to this, the MOS transistors 29a and 29b enter conducting and non-conducting states respectively, and the voltage on the internal node 30 is brought to the level of the ground potential Vss. In response to the ground voltage Vss on the internal node 30, the MOS transistors 31a and 31b enter non-conducting and conducting states respectively, and the back gate voltage VNB from the signal line 32 is brought to the level of the low-level back gate voltage VNBL. Thus, the back gate voltage of the n-channel MOS transistor included in the internal circuit is brought to the level of the low-level back gate voltage VNBL, and its threshold voltage is increased.

When the activation signal /CE is at a low level and the internal circuit operates in an active cycle, on the other hand, the MOS transistor 22 conducts to transmit the power supply voltage Vcc to the node 23. Due to level shifting by the diodes 26a and 26b, the voltage of the node 24 exceeds the level of the ground voltage Vss, the MOS transistors 29a and 29b enter non-conducting and conducting states respectively, and the voltage on the internal node 30 is brought to the level of the low-level back gate voltage VNBL. In response to this, the MOS transistors 31b and 31a enter non-conducting and conducting states respectively, and the back gate voltage VNB on the signal line 32 is brought to the level of the ground voltage Vss. Thus, the n-channel MOS transistor of the internal circuit has the threshold voltage decreased, to attain a high-speed operation.

In the back gate voltage switching circuit shown in FIG. 30, a level shift circuit employing the diodes 26a and 26b prevents application of a voltage of the sum of the power supply voltage Vcc and the absolute value of the low-level back gate voltage VNBL between the gate and the source of each MOS transistor, thereby ensuring the reliability of the element.

In the structure shown in FIG. 30, however, a current path from the power supply line 20 to the low-level back gate voltage transmission line 27 is formed when the activation signal /CE goes low, and a current flows from the power supply line 20 to the line 27 in an active cycle. Thus, the level of the low-level back gate voltage VNBL is increased, and in order to absorb this voltage increase, the low-level back gate voltage VNBL is required to be supplied from the exterior. In case of generating the low-level back gate voltage VNBL on chip, it is necessary to absorb the current flowing through the current path formed by the MOS transistors 22 and 24, the diodes 26a and 26b and the transistor 28 and hold the back gate voltage VNBL at a constant voltage level. Thus, it is necessary to employ a back gate voltage generation circuit having high current drivability, with a large occupying area. When such a back gate voltage generation circuit having high drivability is employed, current consumption of the circuit is increased and an unnecessary current is consumed. Thus, the structure of the back gate voltage switching circuit shown in FIG. 30 is unsuitable for employment in an on-chip back gate voltage generation circuit.

FIG. 31 illustrates the structure of still another exemplary back gate voltage switching circuit, which is described in Japanese Patent Laying-Open No. 6-21443 (1994), for example. The back gate voltage switching circuit shown in FIG. 31 includes a switching circuit 35 selecting one of a positive voltage Vb and a ground voltage Vss in accordance with a standby detection signal SD. The voltage selected by the switching circuit 35 is supplied to a back gate of an n-channel MOS transistor 40a which is a component included in an internal circuit 40.

When the standby detection signal SD indicates that the internal circuit 40 is in the standby state, the switching circuit 35 selects the ground voltage Vss and supplies the same to the back gate of the MOS transistor 40a. When the standby detection signal SD indicates an active cycle of the internal circuit 40, on the other hand, the switching circuit 35 selects the positive voltage Vb and supplies the same to the back gate of the MOS transistor 40a.

In the structure shown in FIG. 31, a back gate voltage is formed by the positive back gate voltage Vb or the ground voltage Vss, and no large voltage is generated in back gate switching (the difference between a power supply voltage Vcc and the back gate voltage Vb is smaller than the power supply voltage Vcc). When a threshold voltage Vth of the MOS transistor 40a is changed by switching the back gate voltage between the positive voltage Vb and the ground voltage Vss through the switching circuit 35 shown in FIG. 31, however, the following problems arise:

Consider that the threshold voltage Vth of the MOS transistor 40a is brought to 0.1 V when a back gate-to-source voltage VBS is at the level of the positive voltage Vb and brought to 0.4 V when the back gate-to-source voltage VBS is 0 V. As shown in FIG. 32, the value of the voltage Vb, which cannot exceed a built-in voltage (diffusion potential) of 1.0 V of a P-N junction, is smaller than 1.0 V. In order to satisfy the threshold voltage conditions required in case of employing this voltage Vb, therefore, it is necessary to implement a characteristic curve T3 having a considerably steep gradient. In this case, a substrate effect constant K must be increased, from the previous equation (1). This substrate effect constant K is generally expressed as follows:

$$\frac{tox}{\epsilon ox}\sqrt{2 \cdot q \cdot \varepsilon_{si} \cdot NB}$$

where tox represents the thickness of a gate insulating film, εox represents the dielectric constant of the gate insulating film, εsi represents the dielectric constant of a silicon film, NB represents the impurity concentration of a substrate, and q represents a unit electric charge quantity. In order to increase the substrate effect constant K, therefore, the impurity concentration of a substrate region must be increased. Thus, a depletion layer is narrowed, a gate capacitance is increased in response to this, and high-speed operation can not be performed. When the width of the depletion layer is reduced, electric field intensity across this P-N junction, which is inversely proportional to the depletion layer width, is increased, the break-down voltage of the P-N junction is reduced, and the reliability of the element is deteriorated.

When the impurity concentration of the substrate region is increased, further, a diffusion current is generated in proportion to the difference between the impurity concentration of the substrate region and that in a source/drain impurity region of the MOS transistor, and a reverse current (current flowing when a reverse-biased voltage is applied across the P-N junction) is increased in response, to disadvantageously destroy data stored in a memory cell when this MOS transistor is a memory cell transistor, for example. In addition, a leakage current is increased by this reverse current, to disadvantageously increase current consumption.

In case of setting the threshold voltage Vth in accordance with the characteristic curve T3 as shown in FIG. 32, the threshold voltage Vth is remarkably changed by a slight change of the back gate-to-source voltage VBS, and it is difficult to precisely establish a prescribed threshold voltage. When the back gate-to-source voltage VBS is applied in accordance with the characteristic curve T1, on the other hand, the characteristic curve T1 is so gradually changed that the threshold voltage Vth is changed at a rate sufficiently smaller than that of the characteristic curve T3 even if the back gate-to-source voltage VBS is slightly changed. Thus, a prescribed threshold voltage Vth can be stably established.

SUMMARY OF THE INVENTION

An object of the present invention is to provide a semiconductor integrated circuit device which can stably and precisely generate a required back gate voltage depending on an operating cycle without deteriorating the reliability of the device.

Another object of the present invention is to provide a semiconductor integrated circuit which can stably generate a required back gate voltage in an on-chip manner without increasing the number of manufacturing steps.

A semiconductor integrated circuit device according to a first aspect of the present invention includes a plurality of memory cells arranged in rows and columns and formed on a first conductivity type substrate region, a plurality of word lines arranged in correspondence to the respective rows and connecting the memory cells of the corresponding rows respectively, row selection circuitry transmitting a driving voltage having a larger absolute value than a first power supply voltage to a word line corresponding to an addressed row in accordance with an address signal and driving this word line to a selected state, and bias application circuitry for applying a bias voltage to the substrate region.

This bias application circuitry includes a circuit applying a first bias voltage to the substrate region in an active cycle in which the address signal is made valid and a memory cell is selected while applying a second bias voltage which is different in polarity from the first bias voltage with reference to a second power supply voltage to the substrate region in a standby cycle in which the row selection circuitry is in an inactive state. The absolute value of the difference between the second bias voltage and the first power supply voltage is substantially equal to that of the difference between the driving voltage and the second power supply voltage.

According to a second aspect of the present invention, the semiconductor integrated circuit device includes an internal circuit executing a prescribed function when activated. This internal circuit includes an insulated gate field-effect transistor which is formed on a first conductivity type semiconductor substrate region and provided with a source coupled to receive a first reference voltage.

According to the second aspect of the present invention, the semiconductor integrated circuit device further includes bias application circuitry applying a first bias voltage to the substrate region in activation of the internal circuit while applying a second bias voltage which is different in polarity from the first bias voltage with reference to the first reference voltage in inactivation of the internal circuit in accordance with an operating mode instructing signal instructing activation/inactivation of the internal circuit. The arithmetic mean of the first and second bias voltages is substantially equal to the first reference voltage.

A semiconductor integrated circuit device according to a third aspect of the present invention includes a plurality of memory cells arranged in rows and columns, a plurality of word lines arranged in correspondence to the respective rows and connecting the memory cells of the corresponding rows respectively and receiving a driving voltage whose absolute value is larger than that of a first power supply voltage when selected, a peripheral circuit including an insulated gate field-effect transistor formed on a substrate region and performing a prescribed operation when activated, and bias application circuitry for applying a bias voltage to the substrate region of the peripheral circuit. The bias application circuitry includes a circuit applying a first bias voltage to the substrate region in activation of the peripheral circuit while applying a second bias voltage which is different in polarity from the first bias voltage with reference to a second power supply voltage to the substrate region in activation of the peripheral circuit in accordance with an operating mode instruction signal instructing activation/inactivation of the peripheral circuit. The absolute value of the difference between the second bias voltage and the first power supply voltage is substantially equal to that of the difference between the driving voltage and the second power supply voltage.

A semiconductor integrated circuit device according to a fourth aspect of the present invention includes a plurality of memory cells arranged in rows and columns, a plurality of word lines arranged in correspondence to the respective rows and connecting the memory cells of the corresponding rows and receiving a driving voltage whose absolute value is larger than a first reference voltage thereto when selected, a peripheral circuit including an insulated gate field-effect transistor formed on a substrate region and performing a prescribed operation when activated, and bias application circuitry for applying a bias voltage to the substrate region.

The bias application circuitry includes a circuit applying a first bias voltage to the substrate region in activation of the peripheral circuit while applying a second bias voltage which is different in polarity from the first bias voltage with reference to a first power supply voltage to the substrate region in inactivation of the peripheral circuit in accordance with an operating mode instructing signal instructing an active/inactive state of the peripheral circuit. The absolute value of the difference between the second bias voltage and a second power supply voltage is substantially equal to that of the difference between the driving voltage and the second power supply voltage.

The absolute value of the difference between the second bias voltage applied to the substrate region in a standby cycle and the first power supply voltage is substantially equal to that of the difference between the driving voltage transmitted to the selected word line and the second power supply voltage, whereby a voltage of the same order as that for a memory transistor is merely applied between a gate and a source/drain in a back gate voltage generation part, components of this back gate voltage generation part can be formed in the same manufacturing steps for the memory cell transistor, and a required back gate voltage can be generated while maintaining the reliability of the element without increasing the number of the manufacturing steps.

The arithmetic mean of the first voltage applied to the substrate region in an active cycle and the second bias voltage applied in a standby cycle is substantially equal to the first power supply voltage, whereby voltages of the same order are merely applied between a gate and a source/drain in generation of first and second back gate voltages in this back gate voltage generation part, the structure of the back gate voltage generation part can be symmetrized, and a required back gate voltage can be readily generated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 illustrates an exemplary structure of a back gate voltage generation circuit according to an embodiment of the present invention;

FIGS. 8A to 8C illustrate modes of the back gate voltage generation circuit shown in FIG. 7 and a gate-to-source/drain applied voltage of each MOS transistor;

FIG. 9 illustrates the relation between the back gate voltage generation circuit and a memory cell transistor according to the embodiment 1 of the present invention;

FIGS. 10A to 10C illustrate conditions of a back gate voltage VNB for n-channel MOS transistors in the embodiment 1 of the present invention;

FIG. 11 illustrates another structure of the back gate voltage generation circuit in the semiconductor integrated circuit device according to the present invention;

FIG. 12 illustrates the relation of a back gate voltage for p-channel MOS transistors in the semiconductor integrated circuit device according to the present invention;

DESCRIPTION OF THE PREFERRED EMBODIMENTS

Principle Structure of the Invention

Figure 1:
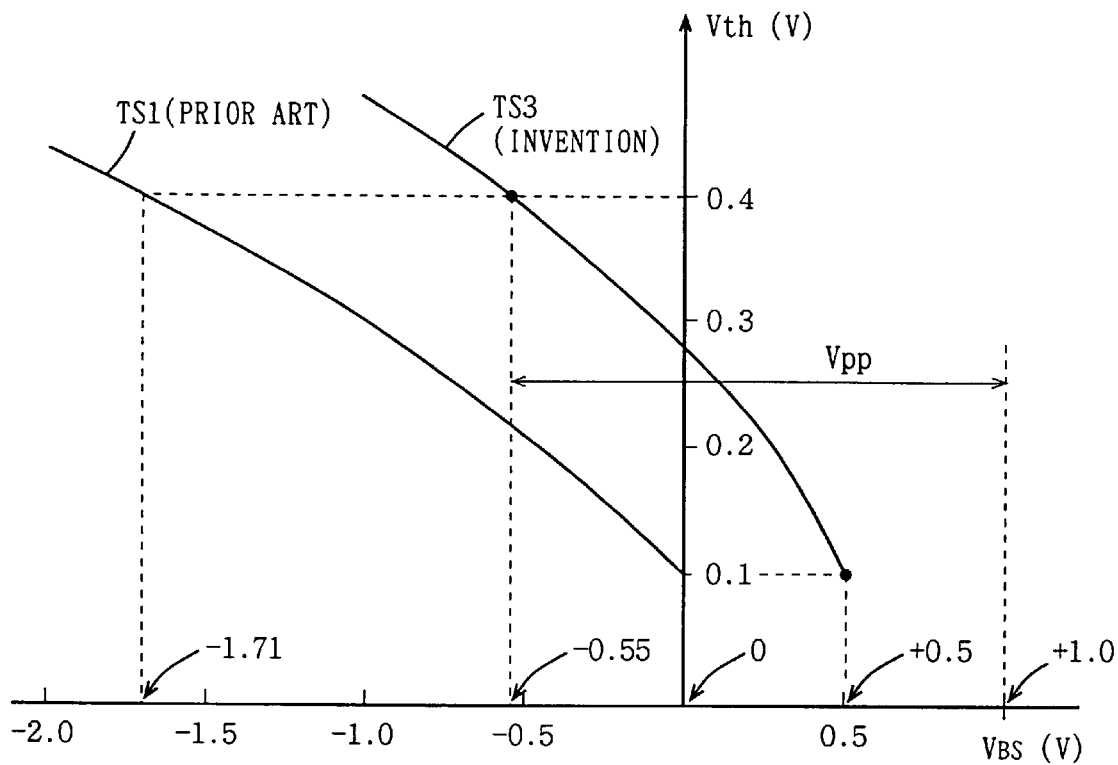
FIG. 1 illustrates back gate voltage application conditions according to the present invention in principle.
Figure 27:
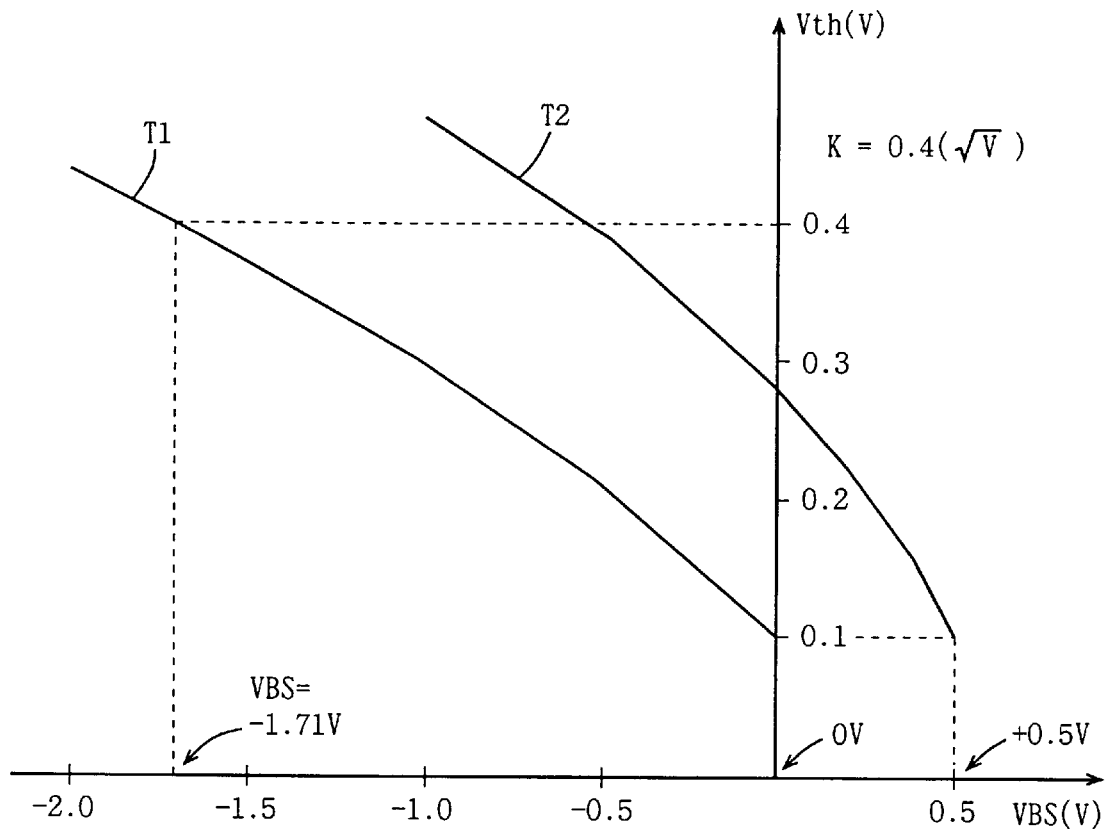
FIG. 27 illustrates the relations between back gate voltages with reference to source potentials and threshold voltages of n-channel MOS transistors.
Figure 28:
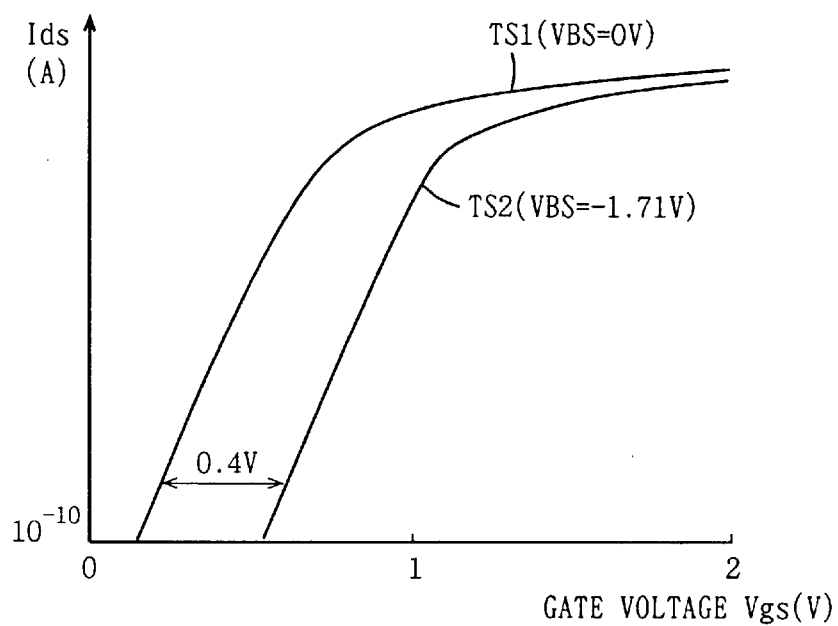
FIG. 28 illustrates the relations between gate voltages with reference to source potentials and drain currents of n-channel MOS transistors.
Figure 29:
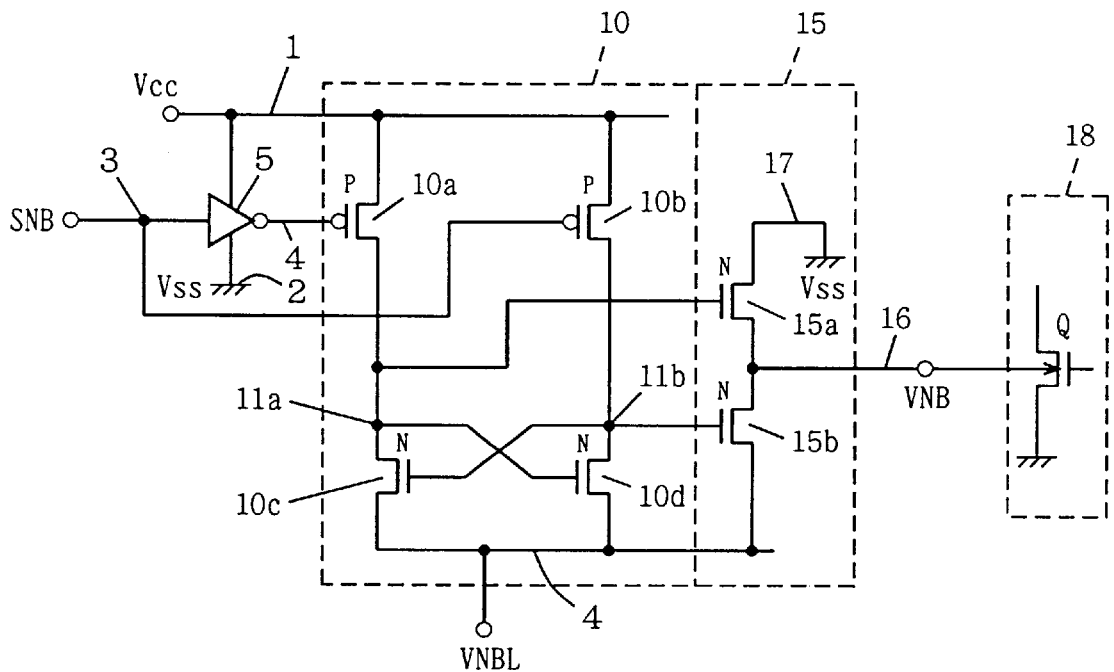
FIG. 29 illustrates the structure of a conventional back gate voltage switching circuit.
Figure 30:
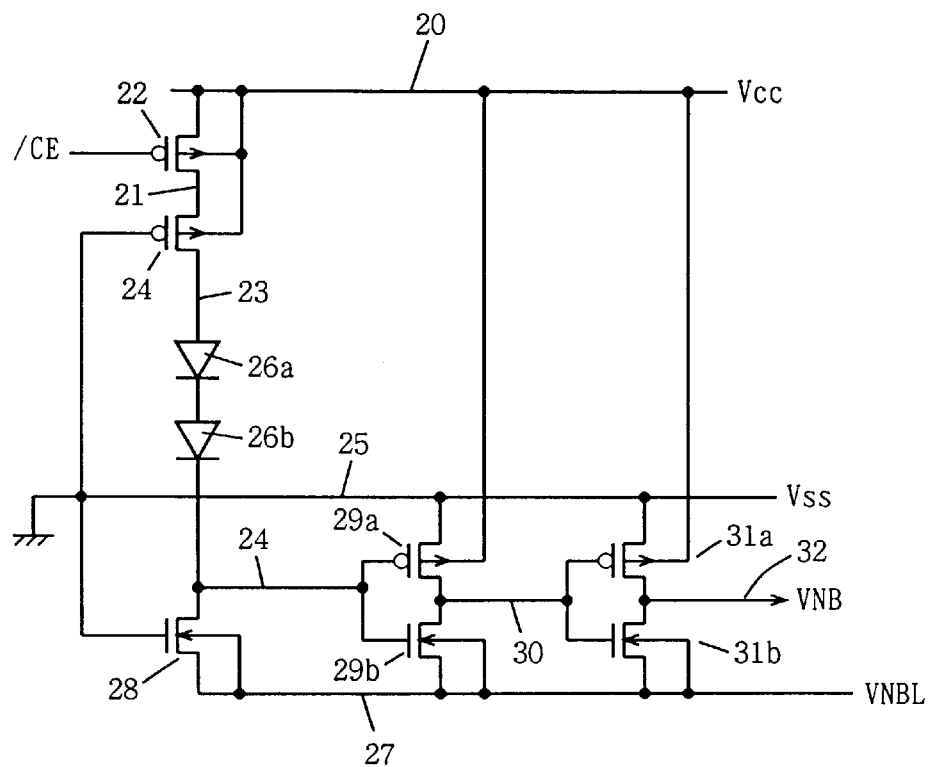
FIG. 30 illustrates another structure of a conventional back gate voltage switching circuit.
Figure 31:
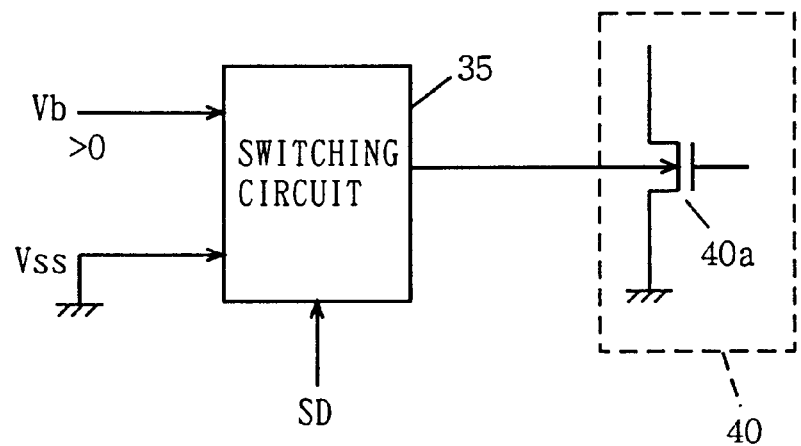
FIG. 31 illustrates still another structure of a conventional back gate voltage switching circuit.

FIG. 1 illustrates the relations between back gate-to-source voltages VBS and threshold voltages Vth according to the present invention and the prior art respectively. Referring to FIG. 1, the axis of ordinates measures the threshold voltages Vth, and the axis of abscissas measures the back gate-to-source voltages VBS. FIG. 1 shows characteristic curves TS1 and TS3 of n-channel MOS transistors. The characteristic curve TS1 is employed for the conventional back gate voltage switching shown in FIG. 27, and the characteristic curve TS3 shows back gate voltage switching according to the present invention. According to the present invention, the back gate-to-source voltage VBS is set on the positive side with reference to-a source potential (ground voltage) in case of implementing a threshold voltage Vth of 0.1 V in an active cycle, as understood from the characteristic curve TS3. If the back gate-to-source voltage VBS exceeds about +0.7 V, a bias voltage for a P-N junction formed by a back gate which is a p-type substrate region and a source which is an n-type impurity region exceeds its diffusion potential and the P-N junction is forwardly biased, resulting in a bipolar transistor operation with the back gate as a base. In order to prevent this, the back gate-to-source voltage VBS applied in an active cycle is set less than +0.7 V.

A back gate voltage for obtaining a threshold voltage Vth of 0.4 V is obtained from a word line driving voltage Vpp. The word line driving voltage Vpp, which is transmitted to a selected word line as described later, is generally set at a value of 1.5 times an internal power supply voltage Vcc. Assuming that the power supply voltage Vcc is equal to 1.0 V, the back gate-to-source voltage VBS is equal to −0.5 V. This condition is implemented by ion implantation into a channel. A voltage VBS for obtaining the threshold voltage Vth of 0.1 V is obtained from the previous equation (1). In this case, a back gate-to-source voltage VBS of about +0.5 V is obtained from the equation (1).

This threshold voltage Vth has a one-half power characteristic, and required threshold voltages Vth of 0.1 V and 0.4 V can be implemented in a voltage range narrower than the conventional one by utilizing a portion having a relatively large gradient (as understood from the characteristic curve TS1, the values of the back gate-to source voltage VBS are 0 V and −1.71 V in the conventional case). Even if the power supply voltage Vcc is 1.0 V, therefore, merely a voltage of 1−(0.5)=1.5 V is applied between the gate and the source of a MOS transistor of a back gate voltage transmission part. This voltage is 1.5 times the power supply voltage Vcc. As hereinabove described, the voltage of a selected word line is boosted in a semiconductor memory device such as a DRAM (dynamic random access memory), for example. The boosted voltage is set at about 1.5 times the power supply voltage Vcc, in consideration of the reliability of an element (memory transistor). Therefore, merely a voltage of about 1.5 times the power supply voltage Vcc is applied even in application of a back gate voltage of −0.55 V which is slightly lower than 0.5 V, and the MOS transistor can be formed in the same manufacturing process as a memory cell transistor, while the reliability of its gate insulating film is guaranteed.

When the absolute values of the back gate-to-source voltages are equalized with each other as +0.5 V and −0.5 to −0.55 V with reference to the source potential (the source potential of the MOS transistor receiving the back gate-to-source voltage VBS), the back gate voltage can be readily generated through a symmetrical circuit.

Figure 32:
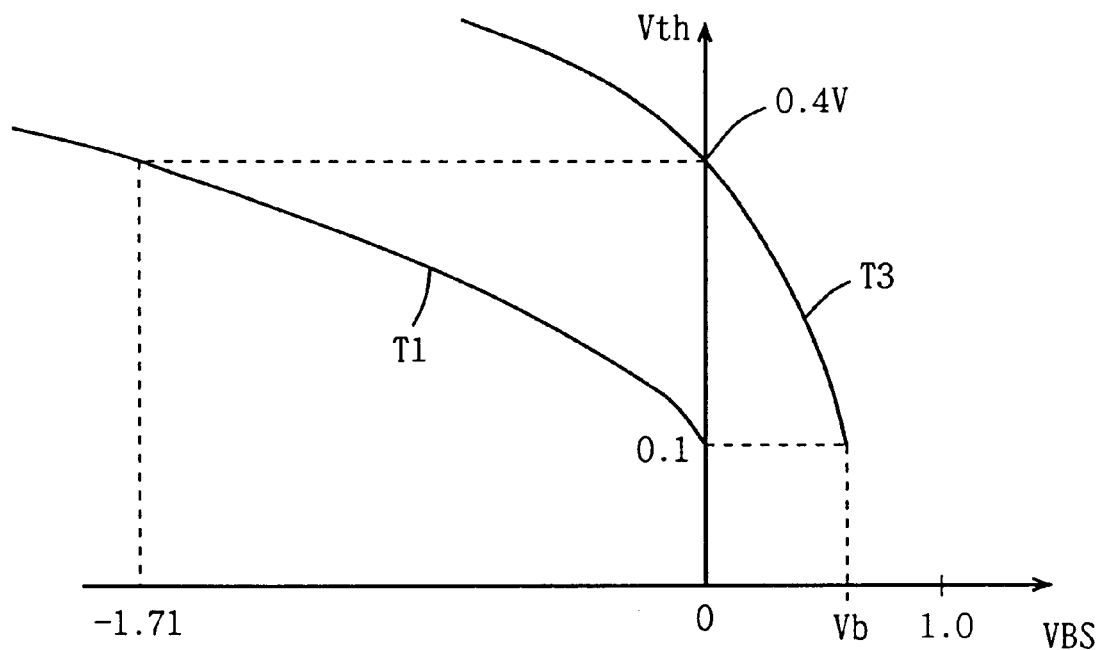
FIG. 32 illustrates problems of the back gate voltage switching circuit shown in FIG. 31.

The amplitude of the back gate-to-source voltage VBS is about 1.05 V, the threshold voltage can be set in a relatively wide voltage range as compared with the structure of implementing threshold voltages of 0.1 V and 0.4 V by applying the ground voltage of 0 V and the positive voltage Vb shown in FIG. 32, and the gradient of the characteristic curve TS3 can be made relatively gentle. When the gradient of a region under use of the characteristic curve TS3 is relatively gentle, the threshold voltage merely slightly fluctuates even if the back gate-to-source voltage VBS slightly fluctuates, and the required threshold voltage can be stably and readily generated. Due to the relatively wide voltage range of the back gate-to-source voltage VBS, it is not necessary to increase the absolute value of a substrate effect constant K, and the element can be stably driven with reliability.

Embodiment 1

Figure 2:
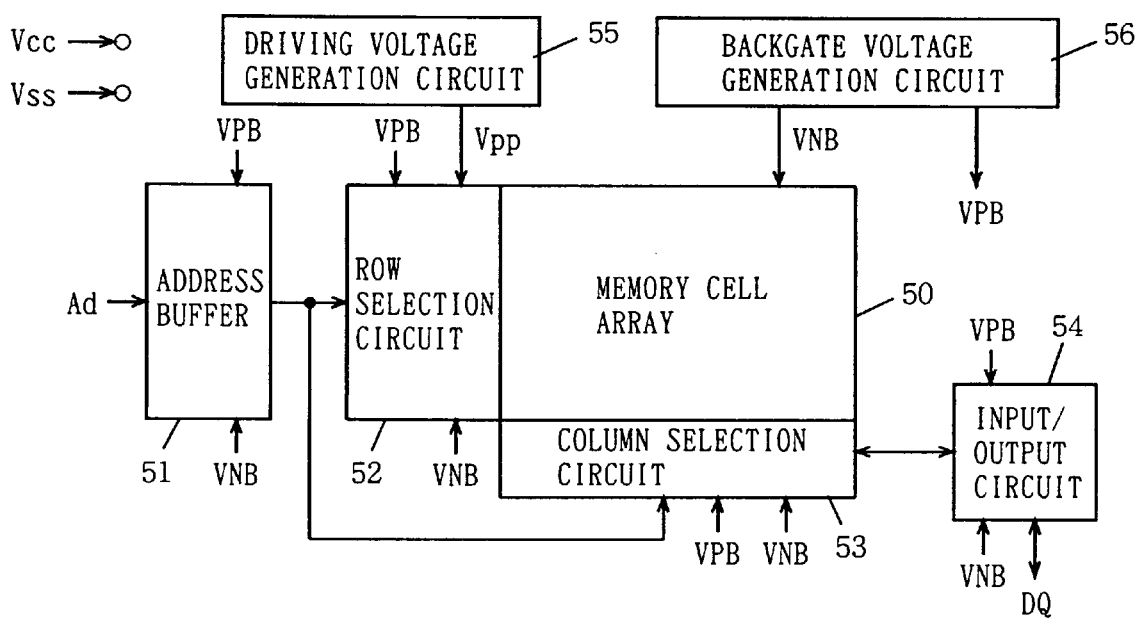
FIG. 2 schematically illustrates the overall structure of a semiconductor integrated circuit device according to an embodiment 1 of the present invention.

FIG. 2 schematically illustrates the overall structure of a semiconductor integrated circuit device according to an embodiment 1 of the present invention. Referring to FIG. 2, the semiconductor integrated circuit a device includes a memory cell array 50 having a plurality of memory cells which are arranged in rows and columns, an address buffer 51 receiving an externally supplied address signal Ad and generating an internal address signal, a row selection circuit 52 receiving an internal row address signal from the address buffer 51 and driving an addressed row of the memory cell array 50 to a selected state, a column selection circuit 53 decoding an internal column address signal supplied from the address buffer 51 and selecting an addressed column of the memory cell array 50, and an input/output circuit 54 transferring data between a memory cell on the column selected by the column selection circuit 53 and the exterior of the device.

In the memory cell array 50 whose internal structure is described later, word lines are arranged in correspondence to the respective rows of the memory cells, and connect the memory cells of the corresponding rows. Further, pairs of bit lines are arranged in correspondence to the respective columns of the memory cells, and connect the memory cells of the corresponding columns.

The semiconductor integrated circuit device further includes a driving voltage generation circuit 55 generating a driving voltage Vpp which is higher than an operating power supply voltage of this semiconductor integrated circuit device and supplying the same to the row selection circuit 52, and a back gate voltage generation circuit 56 generating back gate voltages VNB and VPB to be supplied to n-type and p-type well regions respectively.

The semiconductor integrated circuit device receives a power supply voltage Vcc and a ground voltage Vss from the exterior. The external power supply voltage Vcc may be down-converted in the interior for utilizing the internal down-converted power supply voltage as one operating power supply voltage. Alternatively, the external power supply voltage Vcc may be utilized as the operating power supply voltage. The back gate voltage VNB from the back gate voltage generation circuit 56 is supplied to a substrate region (well region) provided in the memory cell array 50, as well as to N well regions of peripheral circuits such as the row selection circuit 52 and the column selection circuit 53. The back gate voltage VPB is also supplied to the peripheral circuits for the memory cell array 50. This semiconductor integrated circuit device includes MOS transistors as components.

Figure 3:
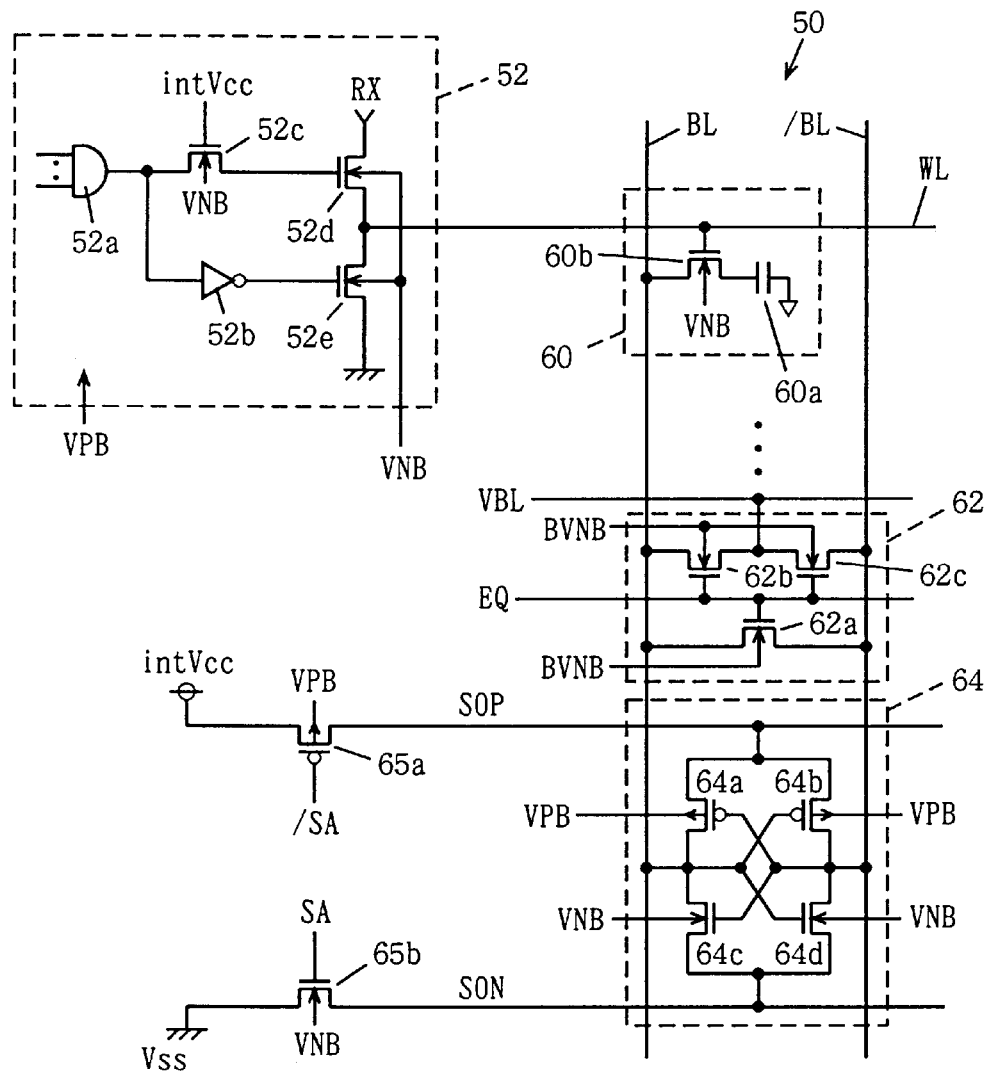
FIG. 3 schematically illustrates the structure of a principal part of the semiconductor integrated circuit device shown in FIG. 2.

FIG. 3 illustrates the structure of a principal part of the semiconductor integrated circuit device shown in FIG. 2. This figure representatively shows a part related to the row selection circuit 52 and a single row and a single column of the memory cell array 50.

Referring to FIG. 3, the memory cell array 50 includes a plurality of memory cells 60 arranged in rows and columns. FIG. 3 representatively shows a single memory cell 60. A word line WL is arranged in correspondence to each row of the memory cells 60, and a pair of bit lines BL and /BL are arranged in correspondence to each column of the memory cells 60. Each memory cell 60 is arranged in correspondence to the intersection between each word line WL and each bit line pair.

The memory cell 60 includes a capacitor 60a for storing information, and an access transistor 60b which is formed by an n-channel MOS transistor and connects the capacitor 60a to the bit line BL in response to a signal potential on the word line WL. This memory cell array 50 comprises a "folded bit line" structure, and no memory cell is present on the intersection between word line WL and bit line /BL. The back gate voltage VNB is supplied to a back gate of the access transistor 60b.

Further, a bit line equalization circuit 62 which is activated in activation of an equalization instruction signal EQ and precharging and equalizing the bit lines BL and /BL at and with a prescribed precharge voltage VBL and a sense amplifier 64 which is activated in response to activation of sense amplifier driving signals SOP and SON for differentially amplifying the potentials of the bit lines BL and /BL are provided for the pair of bit lines BL and /BL.

The bit line equalization circuit 62 includes an n-channel MOS transistor 62a which conducts in response to activation of the equalization instruction signal EQ for electrically short-circuiting the bit lines BL and /BL, and n-channel MOS transistors 62b and 62c which conduct in response to activation of the equalization instruction signal EQ for transmitting the precharge voltage VBL to the bit lines BL and /BL respectively. A back gate voltage BVNB is supplied to back gates of the MOS transistors 62a to 62c.

The sense amplifier 64 includes a p-channel MOS transistor 64a having a first conductive terminal (drain) connected to the bit line BL, a second conductive terminal (source) which is connected to receive the sense amplifier driving signal SOP and a gate connected to the bit line /BL, a p-channel MOS transistor 64b having a first conductive terminal connected to the bit line /BL, a second conductive terminal which is connected to receive the sense amplifier driving signal SOP and a gate connected to the bit line BL, an n-channel MOS transistor 64c having a first conductive terminal (drain) connected to the bit line BL, a second conductive terminal (source) which is connected to receive the sense amplifier driving signal SON, and a gate connected to the bit line /BL, and an n-channel MOS transistor 64d having a first conductive terminal connected to the bit line /BL, a second conductive terminal which is connected to receive the sense amplifier driving signal SON, and a gate connected to the bit line BL.

The sense amplifier driving signal SOP is maintained at an intermediate voltage (the same voltage level as the precharge voltage VBL) when inactive, and pulled up to the level of an internal operating power supply voltage intvcc by a sense amplifier activation transistor 65a which conducts in response to activation of a sense amplifier activation signal /SA. The sense amplifier driving signal SON is maintained at the intermediate voltage level (the same voltage level as the precharge voltage) when inactive, and driven to the ground voltage level by a sense amplifier activation transistor 65b which conducts in response to a sense amplifier activation signal SA when active. The back gate voltage VPB is supplied to back gates of the MOS transistors 64a, 64b and 65a, while the back gate voltage VNB is supplied to those of the MOS transistors 64c, 64d and 65b.

The row selection circuit 52 includes an AND circuit 52a decoding the internal address signal supplied from the address buffer 51 shown in FIG. 2 and outputting a high-level signal when the corresponding word line WL is specified, an invertor 52b inverting the output signal of the AND circuit 52a, an n-channel MOS transistor 52c receiving the internal operating power supply voltage intVcc at its gate and passing the output signal of the AND circuit 52a therethrough, an n-channel MOS transistor 52d conducting, when a signal outputted from the n-channel MOS transistor 52 is at a high level, for transmitting a driving signal RX of the driving voltage Vpp level to the word line WL, and an n-channel MOS transistor 52e conducting, when the output signal of the invertor 52b is at a high level, for driving the word line WL to the ground voltage Vss level.

The back gate voltage VNB is supplied to back gates of the MOS transistors 52c, 52d and 52e. This back gate voltage VNB is also supplied to back gates of n-channel MOS transistors included in the AND circuit 52a and the invertor 52b. The back gate voltage VPB is supplied to back gates of p-channel MOS transistors included in the AND circuit 52a and the invertor 52b. The internal operating power supply voltage intVcc may be obtained by voltage down-converting the external power supply voltage Vcc shown in FIG. 2 in the interior, or may be at the same voltage level as the external power supply voltage Vcc. The word line driving signal RX is generated from the high voltage Vpp and a timing signal (may include an address decode signal).

The bit line equalization circuit 62 is activated in a standby cycle while entering an inactive state in an access cycle, and its activation period is reverse to those of the peripheral circuits such as the row selection circuit 52 and the sense amplifier 64. Thus, the back gate voltage BVNB is applied to the bit line equalization circuit 62 in a mode reverse to that of the back gate voltage VNB supplied to the n-channel MOS transistors of the remaining circuit parts.

Figure 4:
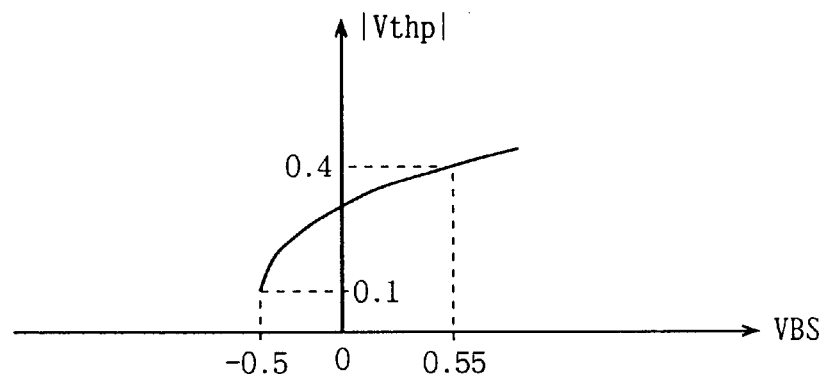
FIG. 4 schematically illustrates back gate voltage application conditions for p-channel MOS transistors in the semiconductor integrated circuit device according to the embodiment 1 of the present invention.

FIG. 4 schematically illustrates the relation between the absolute value of a threshold voltage Vthp of a p-channel MOS transistor and a back gate-to-source voltage VBS. As shown in FIG. 4, the absolute value of the threshold voltage Vthp is increased when the back gate-to-source voltage VBS with reference to a source potential is increased in the p-channel MOS transistor. According to this embodiment, values 0.1 V and 0.4 are utilized for making the absolute value of the threshold voltage Vthp coincide with that of an n-channel MOS transistor when the internal power supply voltage intVcc is 1.0 V. When the absolute value of the threshold voltage Vthp is 0.1 V while –0.5 V and 0.4 V are supplied as the back gate-to-source voltage VBS and the absolute value of the threshold voltage Vthp respectively, the back gate-to-source voltage VBS takes the value of 0.55 V.

Figure 5:
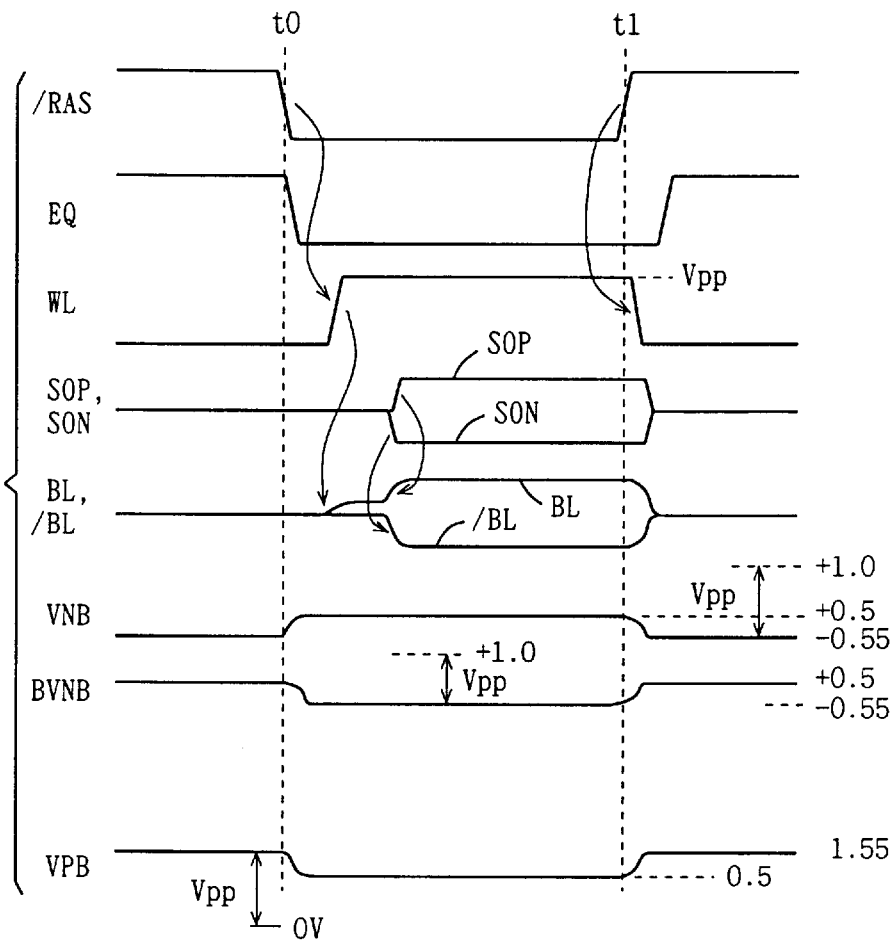
FIG. 5 is a signal waveform diagram representing operations of the circuit shown in FIG. 3.

FIG. 5 is a signal waveform diagram representing operations of the semiconductor integrated circuit device shown in FIG. 3. With reference to FIG. 5, the operations of the integrated circuit device shown in FIG. 3 are now described.

Before a time t0, the semiconductor integrated circuit device is in a standby state, and a row address strobe signal /RAS is in an inactive state of a high level. In the standby state when the row address strobe signal /RAS is at a high level, the back gate voltages VNB and VPB are set at voltage levels of –0.55 V and 1.55 V respectively. The internal power supply voltage intVcc is assumed to be 1.0 V. In this state, the threshold voltage of the access transistor 60b of the memory cell 60 is increased, and a subthreshold current is suppressed. Also in the row selection circuit 52, the threshold voltages of the MOS transistors 52d and 52e are increased, a leakage current from a node to which the driving voltage Vpp of a high level is applied to the ground node is reduced, and leakage currents of the AND circuit 52a and the invertor 52b are reduced.

On the other hand, the back gate voltage BVNB is set at +0.5 V, and the threshold voltages of the MOS transistors 62a to 62c included in the bit line equalization circuit 62 are reduced. Thus, the bit lines BL and /BL are reliably precharged at and equalized with the precharge voltage VBL of the prescribed intermediate voltage level.

The absolute values of the threshold voltages of the sense amplifier activation transistors 65a and 65b are also increased. Thus, leakage currents from a power supply node to a signal line transmitting the sense amplifier driving signal SOP and from a signal line transmitting the sense amplifier SON to a ground node are suppressed.

At the time t0, the row address strobe signal /RAS falls to a low level, to start a memory cycle. In response to this fall of the row address strobe signal /RAS, the back gate voltages are switched. Namely, the back gate voltage VNB is increased from −0.55 V to +0.5 V, while the back gate voltage VPB is reduced from +1.55 V to +0.5 V. Thus, the threshold voltages of the MOS transistors 52d and 52e are reduced in the row selection circuit 52. Further, the absolute values of the threshold voltages of the MOS transistors 65a and 65b for sense amplifier activation are also reduced, while the absolute values of the threshold voltages of the MOS transistors 64a to 64d are also reduced in the sense amplifier 64.

In the bit line equalization circuit 62, on the other hand, the back gate voltage BVNB is reduced from +0.5 V to −0.55 V, and the threshold voltages of the MOS transistors 62a to 62c are increased. In response to the fall of the row address strobe signal /RAS at the time t0, the -equalization instruction signal EQ enters an inactive state of a low level, and the MOS transistors 62a to 62c enter non-conducting states. Therefore, the back gate voltage BVNB is set at a negative voltage level in this state, whereby leakage currents of the MOS transistors 62a to 62c are suppressed and the bit lines BL and /BL are reliably set in electrically floating states.

In response to the fall of the row address strobe signal /RAS, the address buffer 51 shown in FIG. 2 is activated to incorporate the externally supplied address signal Ad and generate an internal row address signal. The row selection circuit 52 decodes the internal row address signal supplied from the address buffer 51, and drives the addressed word line to a selected state in accordance with the result of the decoding. Assuming that the word line WL is selected, the output signal of the AND circuit 52a goes high (to the level of the internal power supply voltage intVcc). The MOS transistor 52d receives the high-level signal through the MOS transistor 52c and conducts to transmit the word line driving signal RX onto the word line WL. This word line driving signal RX is boosted up to the driving voltage Vpp level, whereby the gate potential of the MOS transistor 52d is increased by a self boot strap effect and the word line driving signal RX of the driving voltage Vpp level is transmitted onto the word line WL. The MOS transistor 52c enters a non-conducting state when the gate potential of the MOS transistor 52d is increased, to prevent transmission of the high voltage Vpp to the AND circuit 52a. The MOS transistor 52e is kept in an inactive state by the invertor 52b.

When the potential of the word line WL is increased, the access transistor 60b conducts to transmit charges stored in the capacitor 60a onto the bit line BL. FIG. 5 shows the signal waveform of the bit line BL obtained when the memory cell 60 stores high-level data. The access transistor 60b, whose threshold voltage is reduced due to increase of the back gate voltage VNB, transmits the charges stored in the capacitor 60a onto the bit line BL at a high speed.

When a sufficiently large read voltage is transmitted to the bit line BL, the sense amplifier activation signals SA and /SA are activated, the sense amplifier activation transistors 65a and 65b conduct, and the sense amplifier driving signals SOP and SON are activated at the high level of the power supply voltage intVcc and the ground voltage level respectively. Thus, the sense amplifier 64 is is activated to differentially amplify the potentials of the bit lines BL and /BL. The absolute values of the threshold voltages of the MOS transistors 64a to 64d are reduced, the sense amplifier 64 operates at a high speed, and the potentials of the-bit lines BL and /BL are driven to high and low levels respectively at a faster timing.

Thereafter, data are written/read through a path (not shown). In this write operation and a data restore operation, the voltage of the word line WL is at the high voltage Vpp level. The bit line BL is kept at the power supply voltage intVcc level by the sense amplifier 64, and in order to write data of the power supply voltage intVcc level in the capacitor 60a with no loss of the threshold voltage of the memory cell transistor 60b, the high voltage Vpp is set at a voltage level of about 1.5 times the power supply voltage intVcc, and resistance against the high voltage Vpp is guaranteed for a gate insulating film of the memory cell transistor 60b.

A memory cycle is completed at a time t1, and the row address strobe signal /RAS rises to a high level. In response to this rise of the row address strobe signal /RAS, the back gate voltage VNB is reduced from +0.5 V to −0.55 V, while the back gate voltage VPB is increased from +0.5 to +1.55 V. Thus, the absolute values of the threshold voltages of the respective MOS transistors which are the components are increased. In response to the rise of the row address strobe signal /RAS, further, the word line WL is driven to a non-selected state (the output signal of the AND circuit 54a goes low), then the sense amplifier activation signals SA and /SA are inactivated, the sense amplifier activation transistors 65a and 65b enter non-conducting states, and the sense amplifier driving signals SOP and SON are precharged at the prescribed intermediate voltage level by a circuit (not shown).

Thereafter the bit line equalization instruction signal EQ enters an active state of a high level, the bit line equalization circuit 62 is activated, and the bit lines BL and /BL are precharged at and equalized with the precharge voltage VBL of the prescribed intermediate voltage level.

In this standby state, all circuits but the bit line equalization circuit 62 are in inactive states, the absolute values of the respective threshold voltages are increased, the sub-threshold current is suppressed, and current consumption in the standby state is reduced.

In the structure shown in FIG. 3, the bit-line equalization circuit 62 and the sense amplifier 64 may be supplied not with the back gate voltages BVNB, VPB and VNB but simply with back gate voltages of constant voltage levels (internal operation power supply voltage and ground voltage levels). The sources/drains thereof are set at the precharge voltage VBL of the intermediate voltage level in a standby state, and no currents flows through these MOS transistors when the source-to-drain voltages are 0 V. A high-speed operation can be implemented by reducing the absolute values of the threshold voltages in an active state.

Figure 6:
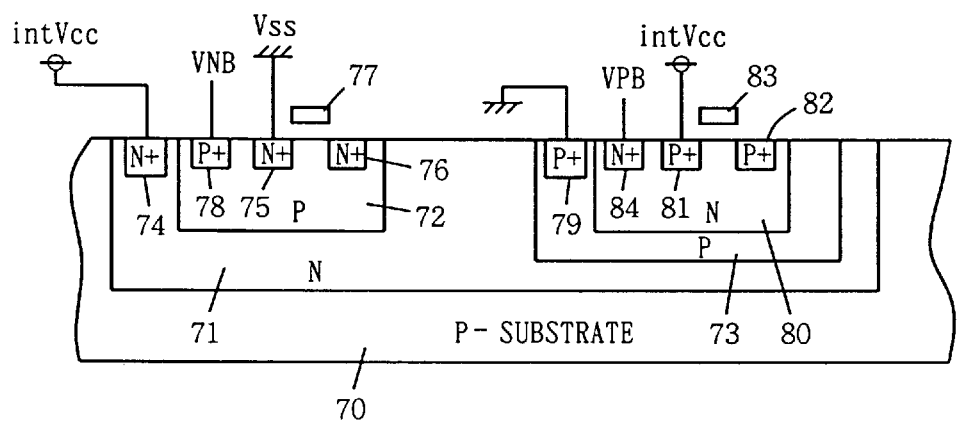
FIG. 6 schematically illustrates sectional structures of MOS transistors in the embodiment 1 of the present invention.

FIG. 6 schematically illustrates sectional structures of the MOS transistors in the semiconductor integrated circuit device according to the embodiment 1. This figure schematically shows the sectional structures of an n-channel transistor and a p-channel MOS transistor included in the peripheral circuits, whose sources are connected to the ground voltage Vss and the internal power supply voltage intVcc respectively.

Referring to FIG. 6, an N-type well 71 is formed on a surface of a p-type semiconductor substrate 70. This N-type well 71 may be an epitaxial layer. P-type wells 72 and 73 are formed separatedly from each other on a surface of the N-type well 71. The N-type well 71 is biased to the internal power supply voltage intVcc level through a high-concentration N-type impurity region 74. High-concentration N-type impurity regions 75 and 76 are formed separatedly from each other on a surface of the P-type well 72. A gate electrode layer 77 is formed on a channel region between these impurity regions 75 and 76 with a gate insulating film (not shown) thereunder. The impurity regions 75 and 76 and the gate electrode layer 77 form the n-channel MOS transistor. The P-type well 72 receives the back gate voltage VNB through a high-concentration P-type impurity region 78. The impurity region 75 serves as a source region, and receives the ground voltage Vss.

The p-channel MOS transistor is formed on an N-type well 80 formed on the surface of the P-type well 73. High-concentration P-type impurity regions 81 and 82 are formed separatedly from each other on a surface of the N-type well 80. A gate electrode layer 83 is formed on a channel region between the impurity regions 81 and 82 with a gate insulating film (not shown) underlaid. The impurity region 81 serves as a source, and receives the internal power supply voltage intVcc. The N-type well 80 receives the back gate voltage VPB through a high-concentration N-type impurity region 84 formed on its surface. On the other hand, P-type well 73 receives the ground voltage Vss through a high-concentration P-type impurity region 79 formed on a surface part outside the N-type well 80.

The wells 72 and 80 forming the MOS transistors are separated from the semiconductor substrate 70, whereby the back gate voltages for these MOS transistors can be changed in response to the operation cycle (operation mode) at a high speed, while the back gate voltages for the n-channel and p-channel MOS transistors can be set independently of each other due to the triple well structure.

The MOS transistors shown in FIG. 6 may be the sense amplifier activation transistors 65a and 65b shown in FIG. 3, or the components forming the invertor 52b or the AND circuit 52a included in the row selection circuit 52.

Structure 1 of Back Gate Voltage Generation Circuit

FIG. 7 illustrates the structure of a back gate voltage generation circuit for generating the back gate voltage VNB for the n-channel MOS transistors. Referring to FIG. 7, the back gate voltage generation circuit includes an invertor 5 operating with the internal power supply voltage intVcc on a power supply line and the ground voltage Vss on a ground line 2 as operating power supply voltages, for inverting an activation signal ACT supplied to an input node 3 and transmitting the same to an output node 4, a level conversion circuit 10 converting the amplitude of an output signal of the invertor 5 to that between the internal power supply voltage intVcc and a low-level back gate voltage VNBL, and a back gate driving circuit 15 selecting one of the low-level back gate voltage VNBL and a high-level back gate voltage VNBH in accordance with an output signal of the level conversion circuit 10 and outputting the same as the back gate voltage VNB.

The level conversion circuit 10 includes a p-channel MOS transistor 10a supplying a current from a power supply line 1 to an internal node 11a in response to the output signal of the invertor 5, a p-channel MOS transistor 10b supplying a current from the power supply line 1 to an internal node 11b in response to the activation signal ACT, and n-channel MOS transistors 10c and 10d connected between a low-level back gate voltage supply line 14 and the internal nodes 11a and 11b respectively for discharging the internal nodes 11a and 11b to the low level back gate voltage VNBL level. The n-channel MOS transistors 10c and 10d are cross-connected with each other to form a flip-flop.

The back gate driving circuit 15 includes an n-channel MOS transistor 15a which conducts, in response to the potential of the internal node 11a, for selecting the high-level back gate voltage VNBH supplied onto a node 90 and transmitting the same to an output node 91, and an n-channel MOS transistor 15b which conducts, in response to the potential on the internal node 11b, for transmitting the low-level back gate voltage VNBL to the output node 91.

The high-level back gate voltage VNBH is 0.5 V, for example, and the low-level back gate voltage VNBL is at a negative value of −1.55 V, for example. These back gate voltages VNBH and VNBL substantially satisfy relations of intVcc−VNBL=Vpp, (VNBL+VNBH)/2=Vss and |VNBH|= |VNBL|, as described later in detail. The operation is now briefly described.

When the activation signal ACT is in an active state of a high level, the p-channel MOS transistors 10a and 10b enter conducting and non-conducting states respectively. The activation signal ACT is transmitted to the node 11a through the conducting p-channel MOS transistor 11a, to increase its potential level. The n-channel MOS transistor 10d conducts in accordance with the potential increase of the internal node 11a, for discharging the internal node 11b and reducing its potential level. The p-channel MOS transistor 10b is in a non-conducting state, and the n-channel MOS transistor 10c shifts to a non-conducting state in response to the potential reduction of the internal node 11b. Finally, the n-channel MOS transistors 10c and 10d enter non-conducting and conducting states respectively, the internal node 11a is charged by the p-channel MOS transistor 10a to the internal power supply voltage intVcc level (1.0 V), and the potential of the internal node 11b is reduced to the low-level back gate voltage VNBL level by the n-channel MOS transistor 10d. In this state, the n-channel MOS transistors 15a and 15b enter conducting and non-conducting states respectively, and the high-level back gate voltage VNBH is selected and transmitted to the output node 91 as the back gate voltage VNB. When the node 11b reaches the voltage VNBL level, no current path from the power supply line 1 to the supply line 14 is present in this level conversion circuit 10.

When the activation signal ACT is in an inactive state of a low level, on the other hand, the p-channel MOS transistors 10a and 10b enter non-conducting and conducting states respectively, and the internal node 11b is charged so that its potential level is increased. In this case, therefore, the n-channel MOS transistor 10c finally conducts to reduce the voltage of the internal node 11a to the low-level back gate voltage VNBL level, while the internal node 11b is charged to the internal power supply voltage intVcc level by the p-channel MOS transistor 10b. In the back gate driving circuit 15, therefore, the n-channel MOS transistors 15b and 15a enter conducting and non-conducting states respectively, and the low-level back gate voltage VNBL is outputted as the back gate voltage VNB. Also in this case, no current path is present in the level conversion circuit 10 in a stable state.

Also when a back gate voltage generation circuit similar to the conventional one is employed, the gate-to-source voltage of each n-channel MOS transistor forming the same is about the high voltage Vpp at the maximum, as shown in FIG. 7. Namely, the maximum voltage is applied when the internal power supply voltage intVcc is supplied to the gate and the low-level back gate voltage VNBL is supplied to the source as shown in FIG. 8A, when the low-level back gate voltage VNBL is supplied to the gate and the internal power supply voltage intVcc is supplied to the drain (the transistor 10c or 10d) as shown in FIG. 8B, or when the internal power supply voltage intVcc is supplied to the gate and the low-level back gate voltage VNBL is supplied to the drain (the transistor 10a or 10c) as shown in FIG. 8C.

The low-level back gate voltage VNBL is set at –0.55 V, for example, and the internal power supply voltage intVcc is 1.0 V. The voltages of these conditions substantially satisfy a relation intVcc+|VNBL|=1.5·intVcc=Vpp. Therefore, the breakdown voltage of the gate insulating film of the memory cell transistor 60b is 5 MV/cm (under the condition that the thickness of a gate oxide film is 50 to 55 Å), for example, and the breakdown resistance of the gate insulating film is guaranteed for the memory cell transistor 60b. Therefore, the breakdown resistance of these n-channel MOS transistors are reliably guaranteed when these transistors are formed in the same process as the memory cell transistor 60b.

Also in each of the p-channel MOS transistors 10a and 10b, the gate-to-drain voltage is maximized when the internal power supply voltage intVcc is received in the gate and the low-level back gate voltage VNBL is received in the drain (see FIG. 8C). Also in this state, the aforementioned conditions are satisfied and the breakdown resistance of these p-channel MOS transistors 10a and 10b can be reliably guaranteed by forming gate insulating films of the p-channel MOS transistors 10a and 10b in the same process as that of the gate insulating film of the memory cell transistor 60b.

As shown in FIG. 9, the memory cell transistor 60b and an n-channel MOS transistor 56a of the back gate voltage generation circuit 56 can be formed in the same steps, and a gate insulation film of a p-channel MOS transistor 56b included in the back gate voltage generation circuit 56 can be formed in the same steps as that for the memory cell transistor 60b (ion implantation is performed in a self-alignment manner with respect to a gate electrode), whereby a back gate voltage generation circuit guaranteed in breakdown resistance can be fabricated without increasing the number of process steps.

Due to different polarity and identical magnitudes (absolute values) (|VNBL|=|VNBH|) with respect to the source potential Vss as shown in FIG. 10A, a voltage applied to a P-N junction between a back gate and a source by the back gate voltage VNB (VNBL) in a standby cycle shown in FIG. 10B and a back gate-to-source voltage in an active cycle shown in FIG. 10C are different in polarity from each other and equal in magnitude to each other. Thus, no voltage stress against the P-N junction is applied in only a single direction and voltage stress across the back gate and the source can be minimized in both standby and active cycles. Thus, breakdown resistance of the P-N junction is guaranteed.

The aforementioned word line driving voltage Vpp and the internal power supply voltage intVcc generally satisfy a relation of Vpp=(3/2)·intVcc. Therefore, a voltage satisfying the following equation may be selected as the low-level back gate voltage VNBL:

(intVcc+|VNBL|)/intVcc=Vpp/intVcc=3/2

Therefore, +0.5 V and –0.5 V may be selected as the aforementioned back gate voltages VNBH and VNBL respectively.

Structure 2 of Back Gate Voltage Generation Circuit

FIG. 11 illustrates another structure of the back gate voltage generation circuit. The back gate voltage generation circuit shown in FIG. 11 has a back gate driving circuit 95 which is different in structure from that in the back gate voltage generation circuit shown in FIG. 7. The remaining portions of the back gate voltage generation circuit shown in FIG. 11 are identical to those shown in FIG. 7, and corresponding portions are denoted by the same reference numerals, to omit the description thereof.

The back gate driving circuit 95 includes a p-channel MOS transistor 95a connected between a signal line 90 transmitting the high-level back gate voltage VNBH and an internal node 96a for receiving a signal on an internal node 11a at its gate, a p-channel MOS transistor 95b connected between the signal line 90 and an internal node 96b and having its gate connected to an internal node 11b, an n-channel MOS transistor 95c connected between the internal node 96a and a signal line 14 transmitting the low-level back gate voltage VNBL and having its gate connected to the internal node 96b, and an n-channel MOS transistor 95d connected between the internal node 96b and the signal line 14 and having its gate connected to the internal node 96a. The internal node 96b is connected to a node 91 outputting the back gate voltage VNB.

This back gate driving circuit 95 is a level conversion circuit converting the internal power supply voltage intVcc and the low-level back gate voltage VNBL outputted from a level conversion circuit 10 to the levels of the high-level back gate voltage VNBH and the low-level back gate voltage VNBL. When the voltage of the internal node 11a is at the low-level back gate voltage VNBL level, the p-channel MOS transistors 95a and 95b enter conducting and non-conducting states respectively. In this state, the internal node 96a is charged to the high-level back gate voltage VNBH level, and the MOS transistor 95d conducts to reduce the voltage level of the internal node 96b. Finally, the n-channel MOS transistor 95d reduces the voltage of the internal node 96b to the low-level back gate voltage VNBL level, and the MOS transistor 95c enters a non-conducting state. Thus, the low-level back gate voltage VNBL is outputted as the back gate voltage VNB.

When the internal nodes 11a and 11b are at the power supply voltage intVcc level and the low-level back gate voltage VNBL level respectively, the p-channel MOS transistors 95a and 95b enter non-conducting and conducting states respectively, and the internal node 96b is charged to the high-level back gate voltage VNBH level. Thus, the high-level back gate voltage VNBH is outputted as the back gate voltage VNB.

Also in this structure, the gate-to-drain voltage of each of the MOS transistors 95a and 95b is at the level of intVcc+|VNBL| at the maximum, and breakdown resistance of its gate insulating film is reliably guaranteed. The E gate-to-source or gate-to-drain voltage of each of the n-channel MOS transistors 95c and 95d is at the level of VNBH+|VNBL| at the maximum and substantially at the internal power supply voltage intVcc level, and its breakdown resistance is sufficiently guaranteed. In the level conversion circuit 10, the gate-to-source or gate-to-drain voltage of each MOS transistor is at the level of intVcc+|VNBL| similarly to the structure shown in FIG. 7, and its breakdown resistance is reliably guaranteed.

In the back gate driving circuit 95 shown in FIG. 11, the gate-to-source voltage of the p-channel MOS transistor 95b in conduction state, which is VNBH+|VNBL|, is higher than that of the n-channel MOS transistor 15a shown in FIG. 7 in conduction state. This p-channel MOS transistor 95b operates in an unsaturated region for charging the output node 91 at a high speed, so that the back gate voltage VNB can be switched from the low-level back gate voltage VNBL to the high-level back gate voltage VNBH at a high speed. In stabilization, all MOS transistors 95a to 95d enter non-conducting states, and no current path is present between the signal lines 90 and 14.

Each of the structures shown in FIGS. 7 and 11 can be readily applied to a circuit structure for generating a back gate voltage VPB applied to a substrate region of a p-channel MOS transistor. The voltage polarity and the conductivity type of the channel of the MOS transistor may simply be inverted.

FIG. 12 schematically illustrates the characteristics of the back gate voltage VPB applied to the back gates of the p-channel MOS transistors according to the embodiment 1 of the present invention. In case of the p-channel MOS transistor, the source receives the internal power supply voltage intVcc as shown in FIG. 12. Therefore, voltages VPBH and VPBL which are higher and lower than the internal power supply voltage intVcc respectively are employed for the back gate voltage VPB. These voltages VPB, intVcc and VPBL satisfy the following relational expression:

VPBH−intVcc=intVcc−VPBL

Therefore, an effect similar to that described with reference to the back gate voltage VNB for the n-channel MOS transistors can be attained by employing the high-level and low-level back gate voltages VPBH and VPBL which are symmetrical with reference to the internal power supply voltage intVcc.

Structure 3 of Back Gate Voltage Generation Circuit

Figure 13:
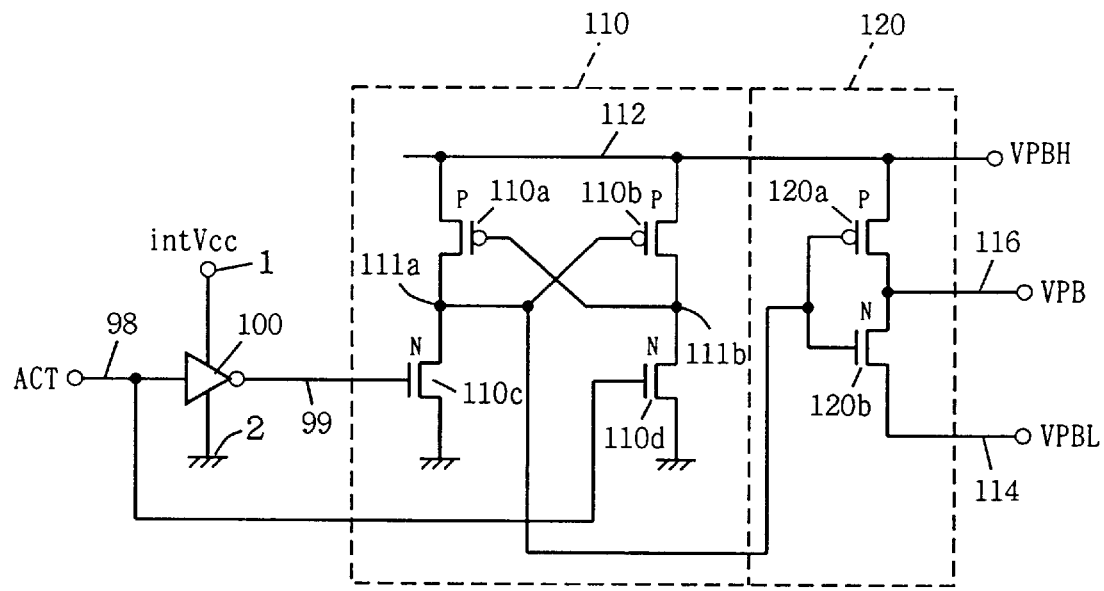
FIG. 13 illustrates an exemplary structure of a back gate voltage generation circuit for p-channel MOS transistors.

FIG. 13 illustrates a still another structure of the back gate voltage generation circuit. Referring to FIG. 13, the back gate voltage generation circuit includes an invertor 100 operating with the internal power supply voltage intVcc on a power supply line (power supply node) 1 and the ground voltage Vss on a ground node (ground wire) 2 both as operating power supply voltages for inverting the activation signal ACT supplied to an input node 98 for transmission to an output node 99, a level conversion circuit 110 converting the amplitude of an output signal of the invertor 100 to the levels of the high-level and low-level back gate voltages VPBH and VPBL, and a back gate driving circuit 120 selecting one of the voltage VPBH and VPBL in accordance with an output signal of the level conversion circuit 110 and outputting the selected voltage as the back gate voltage VPB.

The level conversion circuit 110 includes a p-channel MOS transistor 110a connected between a back gate voltage transmission line 112 transmitting the high-level back gate voltage VPBH and an internal node 11a and having its gate connected to an internal node 111b, a p-channel MOS transistor 110b connected between the back gate voltage transmission line 112 and the internal node 111b and having its gate connected to the internal node 111a, an n-channel MOS transistor 110c connected between the internal node 111a and the ground node 2 and receiving the output signal of the invertor 100 at its gate, and an n-channel MOS transistor 110d connected between the internal node 111b and the ground node 2 and receiving the activation signal ACT at its gate.

The back gate driving circuit 120 includes a p-channel MOS transistor 120a connected between the back gate voltage transmission line 112 and an output node 116 and having its gate connected to the internal node 111a, and an n-channel MOS transistor 120b connected between the output node 116 and a line 114 transmitting the low-level back gate voltage VPBL and having its gate connected to the internal node 111a. The back gate driving circuit 120 serves as a CMOS invertor operating with the voltages VPBH and VPBL both as operating power supply voltages.

The following relations are satisfied:
VPBH−Vss=Vpp−Vss
(VPBL+VPBH)/2=intVcc

The operation is now briefly described.

When the activation signal ACT is at a low level and indicates a standby state, the n-channel MOS transistors 110c and 110d enter conducting and non-conducting states respectively in the level conversion circuit 110. Therefore, the internal node 111a is discharged to the ground voltage level by the MOS transistor 110c. In response to the reduction of the voltage level of the internal node 111a, the p-channel MOS transistor 110b conducts to charge the internal node 111b. In accordance with the increase of the voltage level of the internal node 111b, the p-channel MOS transistor 110a enters a nonconducting state, and the internal node 111a is discharged to the ground voltage level at a high speed in response. Finally, the p-channel MOS transistors 110b and 110a enter conducting and non-conducting states respectively, and the voltage of the internal node 111b reaches the high-level back gate voltage VPBH level. On the other hand, the voltage of the internal node 111a reaches the ground voltage level.

Therefore, the po-channel MOS transistor 120a and the n-channel MOS transistor 120b enter conducting and non-conducting states respectively in the back gate driving circuit 120. Thus, the high-level back gate voltage VPBH is outputted through the output node 116 as the back gate voltage VPB. Thus, the absolute value of the threshold value of each p-channel MOS transistor receiving the back gate voltage VPB at its back gate is increased.

When the activation signal ACT is at a high level, on the other hand, the n-channel MOS transistors 110d and 110c enter conducting and non-conducting states respectively, and the internal node 11a is charged to the high-level back gate voltage VPBH level while the internal node 111b is discharged to the ground voltage level. In this state, the p-channel MOS transistor 120a and the n-channel MOS transistor 120b enter non-conducting and conducting states respectively in the back gate driving circuit 120, and the low-level back gate voltage VPBL is outputted from the output node 116 as the back gate voltage VPB. Thus, the absolute value of the threshold voltage of the p-channel MOS transistor receiving the back gate voltage VPB at its back gate is decreased.

In the structure of the back gate voltage generation circuit shown in FIG. 13, a CMOS invertor is employed for the back gate driving circuit 120. Therefore, the back gate voltage VPB can be switched between the high-level and low-level back gate voltages VPBH and VPBL at a high speed.

Structure 4 of Back Gate Voltage Generation Circuit

Figure 14:
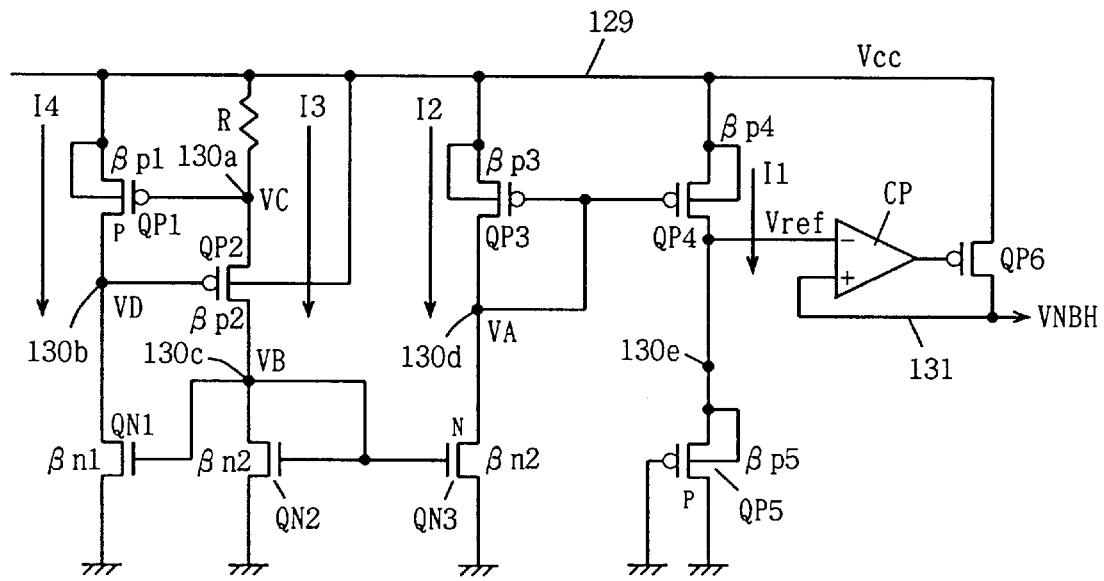
FIG. 14 illustrates an exemplary structure of a back gate voltage generation circuit for n-channel MOS transistors.

FIG. 14 illustrates the structure of a circuit generating the high-level back gate voltage VNBH. Referring to FIG. 14, the back gate voltage generation circuit includes a resistive element R connected between a power supply line 129 and an internal node 130a, a p-channel MOS transistor QP1 connected between the power supply line 129 and an internal node 130b and having its gate connected to the internal node 130a, an n-channel MOS transistor QN1 connected between the internal node 130b and a ground node and having its gate connected to an internal node 130c, a p-channel MOS transistor QP2 connected between the internal nodes 130a and 130c and having its gate connected to the internal node 130b, an n-channel MOS transistor QN2 connected between the internal node 130c and the ground node and having its gate connected to the internal node 130c, a p-channel MOS transistor QP3 connected between the power supply line 129 and an internal node 130d and having its gate connected to the internal node 130d, an n-channel MOS transistor QN3 connected between the internal node 130d and the ground node and having its gate connected to the internal node 130c, a p-channel MOS transistor QP4 connected between the power supply line 129 and an internal node 130e and having its gate connected to the internal node 130d, and a p-channel MOS transistor QP5 connected between the internal. node 130e and the ground node and having its gate connected to the ground node. These MOS transistors QP1 to QP5 and QN1 to QN3 form a circuit generating a reference voltage Vref.

The back gate voltage generation circuit further includes a compare circuit CP comparing the reference voltage Vref with the voltage VNBH on an output node 131, and a p-channel MOS transistor QP6 supplying a current from the power supply line 129 to the output node 131 in accordance with an output signal of the compare circuit CP. The output node 131 outputs the high-level back gate voltage VNBH. The operation of the back gate voltage generation circuit shown in FIG. 14 is now briefly described.

It is assumed that the n-channel MOS transistor QN1 has a transmission coefficient $\beta n1$ and serves as a high resistance, while the MOS-transistors QN2 and QN3 have the same transmission coefficients $\beta n2$ and the p-channel MOS transistors QP1 to QP5 have transmission coefficients $\beta p1, \beta p2, \beta p3, \beta p4$ and $\beta p5$ respectively. It is also assumed that the transmission coefficient $\beta p1$ is sufficiently larger than the transmission coefficient $\beta n2$. While the power supply voltage Vcc on the power supply line 129 may be supplied from the exterior or provided by an internally produced power supply voltage, the power supply line 129 preferably receives an external power supply voltage Vcc in order to generate the high-level back gate voltage VNBH with margin.

A current I3 fed through the resistive element R flows through the MOS transistors QP2 and QN2. The MOS transistor QN2 forms a current mirror circuit together with the MOS transistor QN1, and currents of the same magnitude flow to these MOS transistors QN1 and QN2. The MOS transistor QN1 is supplied with the current from the MOS transistor QP1. The transmission coefficient $\beta n1$ of the MOS transistor QN1 is sufficiently smaller than the transmission coefficient $\beta p1$ of the MOS transistor QP1, and hence the p-channel MOS transistor QP1 supplies a current I4 keeping the gate-to-source voltage thereof at a threshold voltage VTP. When the current I3 is increased and a voltage Vc of the node 130a is reduced, the current I4 flowing through the p-channel MOS transistor QP1 is increased to increase the level of a voltage VB of the node 130b. In response, the current of the p-channel MOS transistor QP2 is limited, and the increased current I3 is reduced.

When the current I3 is reduced and the voltage Vc of the node 130a is increased, the current I4 supplied by the p-channel MOS transistor QP1 is reduced. Thus, the n-channel MOS transistor QN1 discharges the node 130b (acts as a resistance for reducing a voltage VD of the node 130b), the voltage VD of the node 130b is reduced, and the conductance of the MOS transistor QP2 is increased to increase the current I3 and reduce the level of the voltage Vc of the node 130a. Thus, the p-channel MOS transistors QP1 and QP2 and the n-channel MOS transistors QN1 and QN2 serve as a constant current circuit, and the current I3 is determined by the voltage across the resistive element R and its resistance value R.

On the other hand, the n-channel MOS transistor QN2 forms a current mirror circuit together with the n-channel MOS transistor QN3, and currents of the same magnitude flow in the MOS transistors QN2 and QN3. A voltage VA of the node 130d is determined by a current I2 supplied by the MOS transistor QP3. The MOS transistor QP3, whose gate and drain are interconnected with each other, operates in a saturated region, whereby the voltage VA of the node 130d can be obtained from a drain current in this saturated region. The MOS transistors QP3 and QP4 form a current mirror circuit, and a mirror current I1 of the current I2 flowing in the MOS transistor QP3 flows in the MOS transistor QP4. The ratio of the current I1 to the current I2 is provided by the ratio of the transmission coefficient $\beta p4$ to the transmission coefficient $\beta p3$.

The current I1 supplied by the MOS transistor QP4 flows through the MOS transistor QP5. The MOS transistor QP5, whose gate is connected to the ground node, operates in a saturated region, and hence the voltage of the node 130e, i.e., the reference voltage Vref is determined by the values of the current I1 and a current flowing through the MOS transistor QP5 in the saturated region. This reference voltage Vref is expressed as follows:

$$V_{ref} = \sqrt{\frac{2 \cdot \beta p4 \cdot (-VTP)}{\beta p5 \cdot \beta p3 \cdot R}} - VTP$$

Assuming that $\beta p4 = n \cdot \beta p3$, the current I1 is expressed as $n \cdot I2$. In this case, therefore, the reference voltage is expressed as follows:

$$V_{ref} = \sqrt{\frac{2n \cdot (-VTP)}{\beta p5 \cdot R}} - VTP$$

Namely, the reference voltage Vref depends on the threshold voltages VTP of-the p-channel MOS transistors QP1 to QP5 (these threshold voltages are assumed to be equal to each other), the transmission coefficient $\beta p5$ of the p-channel MOS transistor Qp5, the resistance value of the resistive element R, and the mirror ratio n of the p-channel MOS transistors QP3 and QP4. Namely, the reference voltage Vref is a constant voltage not depending on the power supply voltage Vcc.

When the voltage VNBH on the output node 131 is higher than the reference voltage Vref, the compare circuit CP outputs a high-level signal, and brings the p-channel MOS transistor QP6 into a non-conducting state. If the voltage VNBH of the output node 131 is lower than the reference voltage Vref, on the other hand, the compare circuit Cp outputs a low-level signal, and increases the conductance of the p-channel MOS transistor QP6, which in turn supplies a current from the power supply line 129 to the output node 131, and increases the level of the voltage VNBH. Therefore, the high-level back gate voltage VNBH is substantially equalized with the level of the reference voltage Vref.

Low-Level Back Gate Voltage VNBL Generation Circuit

Figure 15:
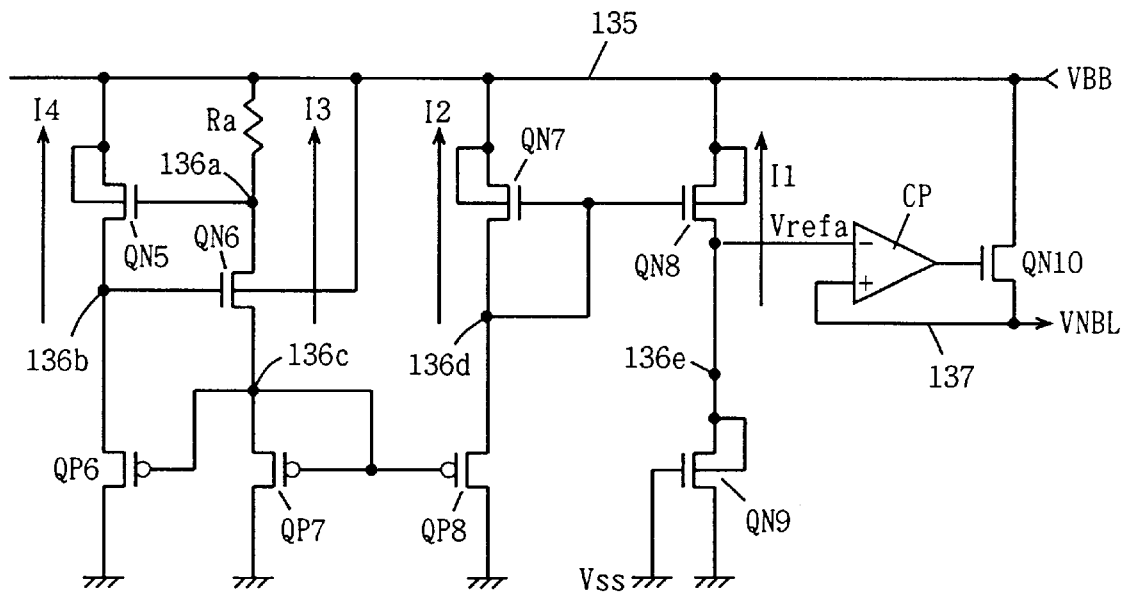
FIG. 15 illustrates the structure of a back gate voltage generation circuit for n-channel MOS transistors in the present invention.

FIG. 15 illustrates the structure of a circuit generating the low-level back gate voltage VNBL for the n-channel MOS transistors. Referring to FIG. 15, the low-level back gate voltage generation circuit operates with the ground voltage on a ground line and a negative voltage VBB on a negative voltage transmission line 135 both as operating power supply voltages and generates the negative low-level back gate voltage VNBL.

This low-level back gate voltage generation circuit includes a resistive element Ra connected between the negative voltage transmission line 135 and an internal node 136a, an n-channel MOS transistor QN5 connected between the negative voltage transmission line 135 and an internal node 136b and having its gate connected to the internal node 136a, an n-channel MOS transistor QN6 connected between the internal node 136a and an internal node 136c and having its gate connected to the internal node 136b, a p-channel MOS transistor QP6 connected between the internal node 136b and the ground node and having its gate connected to the internal node 136c, a p-channel MOS transistor QP7 connected between the internal node 136c and the ground node and having its gate connected to the internal node 136c, an n-channel MOS transistor QN7 connected between the negative voltage transmission line 135 and an internal node 136d and having *its gate connected to the internal node 136d, a p-channel MOS transistor QP8 connected between the internal node 136d and the ground node and having its gate connected to the internal node 136c, an n-channel MOS transistor QN8 connected between the negative voltage transmission line 135 and an internal node 136e and having its gate connected to the internal node 136d, and an n-channel MOS transistor QN9 connected between the internal node 136e and the ground node and having its gate connected to the ground node.

Transmission coefficients β of the p-channel MOS transistors QP6 to QP8 are made sufficiently smaller than the transmission coefficient β of the n-channel MOS transistor QN5. The internal node 136e outputs a reference voltage Vrefa.

The low-level back gate voltage generation circuit further includes a compare circuit CP comparing the back gate voltage VNBL on an output node 137 with the reference voltage Vrefa, and an n-channel MOS transistor QN10 connected between the output node 137 and the negative voltage transmission line 135 and supplying a current from the output node 137 to the negative voltage transmission line 135 and adjusting the level of the voltage VNBL in accordance with an output signal of the compare circuit CP.

In the circuit part generating the reference voltage Vrefa, the conductivity types of channels of the MOS transistors are entirely reversed as compared with those of the circuit part generating the reference voltage Vref shown in FIG. 14, and the negative voltage VBB is employed in place of the power supply voltage Vcc. Therefore, the reference voltage generation part shown in FIG. 15 operates similarly to the reference voltage generation part shown in FIG. 14 (the currents flow in an opposite direction), and the internal node 136e outputs the reference voltage Vrefa expressed as follows:

$$V_{ref}a = -\sqrt{\frac{2n \cdot VTN}{\beta n9 \cdot Ra}} - TVTN$$

where βn9 represents the transmission coefficient of the n-channel MOS transistor QN9, and VTN represents threshold voltages of the n-channel MOS transistors QN5 to QN8.

The compare circuit CP operates with the negative voltage VBB as one operating power supply voltage. The other power supply voltage may be either the power supply voltage Vcc or the ground voltage Vss. If the voltage VNBL on the output node 137 is higher than the reference voltage Vrefa, the output signal of the compare circuit Cp goes high, the conductance of the n-channel MOS transistor QN10 is increased, an increased current flows from the output node 137 to the negative voltage transmission line 135, and the level of the voltage VNBL is reduced. If the voltage VNBL is lower than the reference voltage Vrefa, on the other hand, the compare circuit CP outputs a signal of a low level (the negative-voltage VBB level), to bring the MOS transistor Qn10 into a non-conducting state. Therefore, the voltage VNBL from the output node 137 is at the level of the reference voltage Vrefa.

Figure 16:
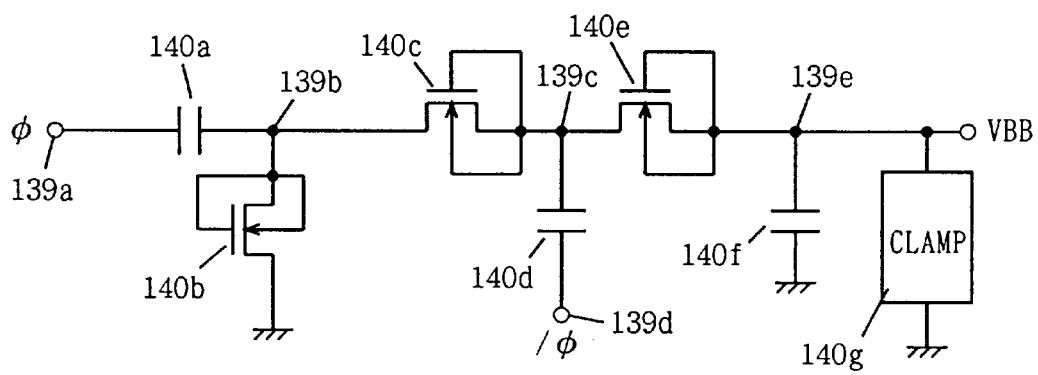
FIG. 16 illustrates an exemplary circuit structure for generating a negative voltage shown in FIG. 15.

FIG. 16 illustrates an exemplary structure of a circuit generating the negative voltage VBB. Referring to FIG. 16, the negative voltage generation circuit includes a capacitor 140a connected between nodes 139a and 139b and performing a charge pump operation in accordance with a clock signal φ, an n-channel MOS transistor 140b connected between the node 139b and a ground node and having its gate connected to the node 139b, an n-channel MOS transistor 140c connected between the node 139b and a node 139c and having its gate connected to the node 139c, a capacitor 140d connected between the node 139c and a node 139d and for performing a charge pump operation in accordance with a clock signal /φ supplied to the node 139d, an n-channel MOS transistor 140e connected between the node 139c and a node 139e and having its gate connected to the node 139a, a stabilizing capacitance 140f connected between the node 139e and the ground node, and a clamp circuit 140g connected between the node 139e and the ground node and for clamping a voltage of the negative voltage VBB level outputted from the node 139e at a prescribed voltage level.

The MOS transistors 140b, 140c and 140e operate as diodes, and threshold voltages thereof are sufficiently small.

In the structure of the negative voltage generation circuit shown in FIG. 16, the node 139b is changed in voltage between voltages Vt and Vt–Vcc due to a clamping function of the MOS transistor 140b and the charge pumping operation of the capacitor 140a. The clock signals φ and /φ are changed between the ground voltage Vss and the power supply voltage Vcc. The voltage Vt represents the threshold voltages of the MOS transistors 140b, 140c and 140e.

The MOS transistor 140c conducts when the node 139c is at a high voltage level. The clock signals φ and /φ are complementary with each other, and the voltage level of the node 139c is reduced when that of the node 139b is increased. Therefore, the voltage level of the node 139*c* is changed between 2·Vth–Vcc and 2·Vt–2·Vcc.

The MOS transistor 140*e* operates as a diode, and conducts when the voltage level of the node 139*e* is higher than that of the node 139*c*. The MOS transistor 140*e* enters a non-conducting state when the potential difference between the nodes 139*e* and 139*c* is smaller than the threshold voltage Vt. Therefore, the voltage level of the node 139*e* is provided as –(2·Vcc–3·Vt). The voltage of the node 139*e* is clamped at a prescribed voltage level by the function of the clamp circuit 140*g*. Thus, the negative voltage VBB having a prescribed voltage level is generated. The negative voltage VBB from the node 139*e* is stabilized by the stabilizing capacitance 140*f*. The level of the negative voltage VBB is kept at about –1 V to –0.75 V. The clamp circuit 140*g* may not be provided, depending on the level of the negative voltage generated by the charge pump operation.

When the back gate voltage generation circuits shown in FIGS. 14 and 15 are employed, the back gate voltages VNBH and VNBL whose absolute values are identical to each other with reference to the ground voltage Vss can be generated by inverting the conductivity types of the channels of the MOS transistors and employing the negative voltage VBB in place of the power supply voltage Vcc, as seen from aforementioned equation. Further, the voltage levels of the generated back gate voltages VNBH and VNBL can be stabilized by employing feedback loops consisting of generating the reference voltages Vref and Vrefa, comparing the same with the back gate voltages and further adjusting the voltage levels in accordance with the results of the comparison, and the threshold voltage of the MOS transistor receiving the back gate voltages VNBL and VNBH can be reliably set at a desired voltage level.

Particularly when the level of the high-level back gate voltage VNBH which is set at a voltage level close to a diffusion potential (about 0.7 V) of a P-N junction is precisely adjusted, and the high-level back gate voltage VNBH does not exceed the diffusion potential, whereby the P-N junction can be reliably inhibited from being forward-biased to prevent a current from flowing from the substrate region to the impurity region.

Back Gate Voltage Generation Circuit for p-Channel MOS Transistor

Figure 17:
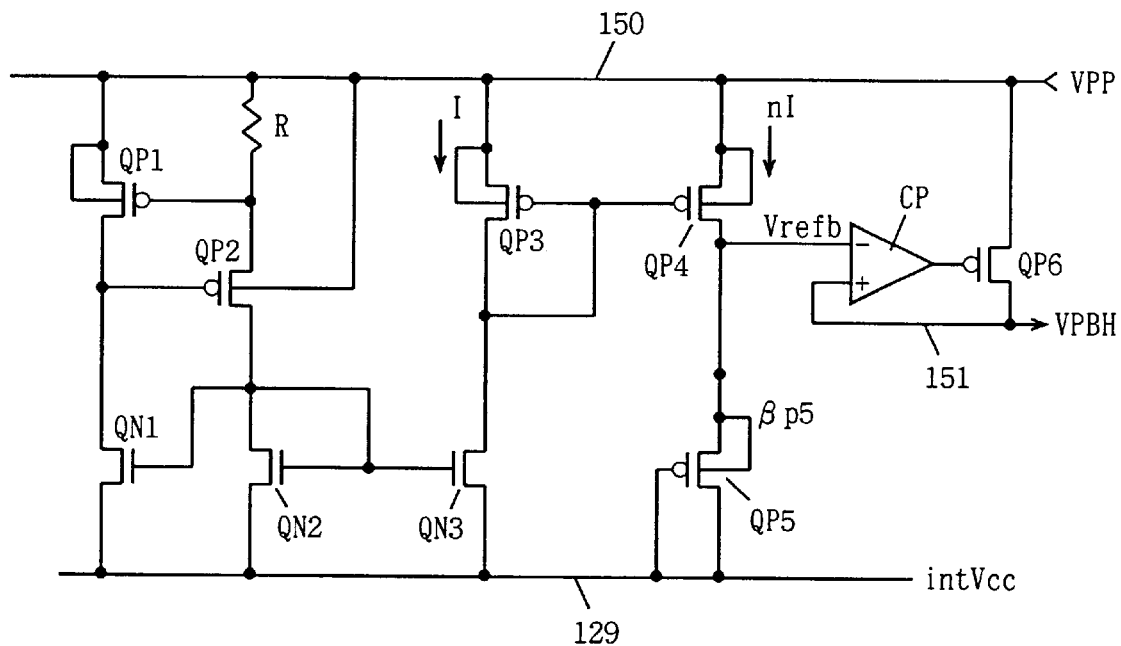
FIG. 17 illustrates an exemplary circuit structure for generating the back gate voltage for p-channel MOS transistors.

FIG. 17 illustrates the structure of a circuit generating the high-level back gate voltage VPBH supplied to the back gates of the p-channel MOS transistors. The structure of the back gate voltage generation circuit shown in FIG. 17 is different from that of the back gate voltage generation circuit for the voltage VNBH shown in FIG. 14 in points that a high voltage VPP (different from the word line driving voltage Vpp) higher than the internal power supply voltage intVcc is employed in place of the internal power supply voltage intVcc supplied to the power supply line 129, and that the internal power v supply voltage intVcc on the internal power supply line 129 is employed in place of the ground voltage Vss, and the remaining circuit structure of the circuit of FIG. 17 is identical to that of the circuit of FIG. 14. Hence, corresponding portions are denoted by the same reference numerals, to omit the description thereof.

In the structure shown in FIG. 17, an output node 151 outputs the high-level back gate voltage VPBH. A reference voltage Vrefb, which is measured with reference to the internal power supply voltage intVcc, can be expressed as follows:

$$V_{ref}b = \sqrt{\frac{2n \cdot (-VTP)}{\beta p5 \cdot R}} - VTP + intVcc$$

Figure 18:
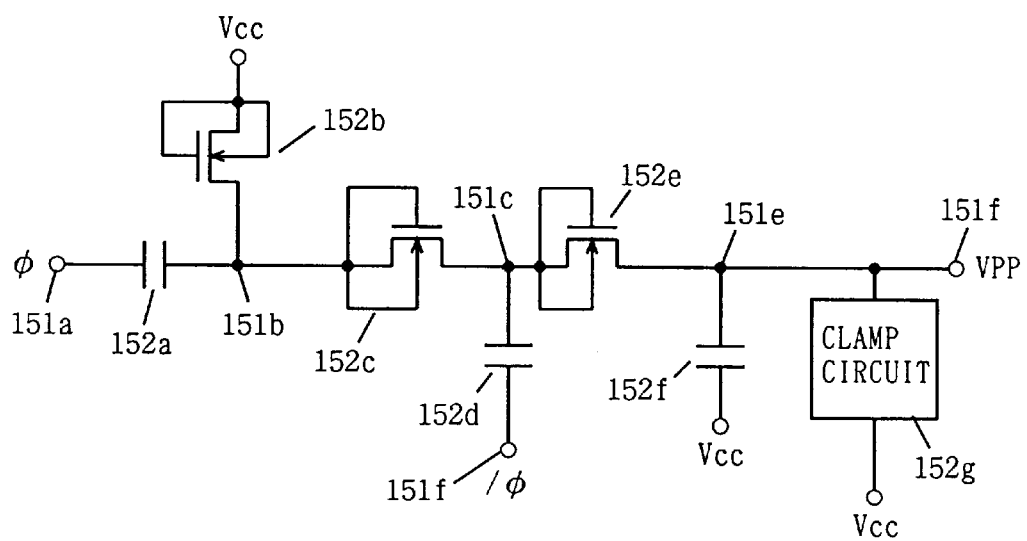
FIG. 18 illustrates an exemplary circuit structure for generating a high voltage VPP shown in FIG. 17.

FIG. 18 illustrates an exemplary circuit structure of a circuit generating the high voltage VPP shown in FIG. 17. Referring to FIG. 18, the high voltage generation circuit includes a capacitor 152*a* connected between nodes 151*a* and 151*b* and performing a charge pump operation in accordance with the clock signal φ supplied to the node 151*a*, an n-channel MOS transistor 152*b* connected between a power supply node and the node 151*b* and having its gate connected to the power supply node, an n-channel MOS transistor 152*c* connected between the node 151*b* and a node 151*c* and having its gate connected to the node 151*b*, a capacitor 152*d* connected between a node 151*f* and the node 151*c* and performing a charge pump operation in accordance with the clock signal /φ supplied to the node 151*f*, an n-channel MOS transistor 152*e* connected between the node 151*c* and a node 151*e* and having its gate connected to the node 151*c*, a stabilizing capacitance 152*f* connected between the node 151*e* and the power supply node and stabilizing the potential of the node 151*e*, and a clamp circuit 152*g* coupled to the node 151*e* and clamping the voltage of the node 151*e* at a prescribed voltage level. A second node of the clamp circuit 152*g* is connected to the power supply node. The node 151*e* is connected to an output node 151*f*, which outputs the high voltage VPP.

The MOS transistors 152*b*, 152*c* and 152*e* are low Vt transistors having low threshold voltages. The MOS transistor 152*b* clamps a low level voltage of the node 151*b* at the level of Vcc–Vt. Therefore, the voltage of the node 151*b* is changed between Vcc–Vt and 2·Vcc–Vt.

The MOS transistor 152*c* conducts when the voltage of the node 151*b* is higher than that of the node 151*c* by the threshold voltage Vt. Therefore, the MOS transistor 152*c* clamps the low level voltage of the node 151*c* at 2·Vcc–2·Vt. The node 151*c* has a voltage amplitude of Vcc due to the charge pumping operation of the capacitor 152*d*. Therefore, the voltage of the node 151*c* is changed between 3·Vcc–2·Vt and 2·Vcc–2·Vt.

The MOS transistor 152*e* enters a non-conducting state when the voltage difference between the nodes 151*c* and 151*e* is smaller than its threshold voltage Vt. Therefore, the voltage level of the node 151*e* is 3·Vcc–3·Vt. If the node 151*e* is at a high voltage level, the output node 151*f* outputs the high voltage VPP clamped at the prescribed voltage level by the clamp circuit 152*g*. This high voltage VPP is stabilized by the stabilizing capacitance 152*f*. The clamp circuit 152*g* may not be provided, depending on the voltage level generated by the charge pump operation.

Low-Level Back Gate Voltage Generation Circuit

Figure 19:
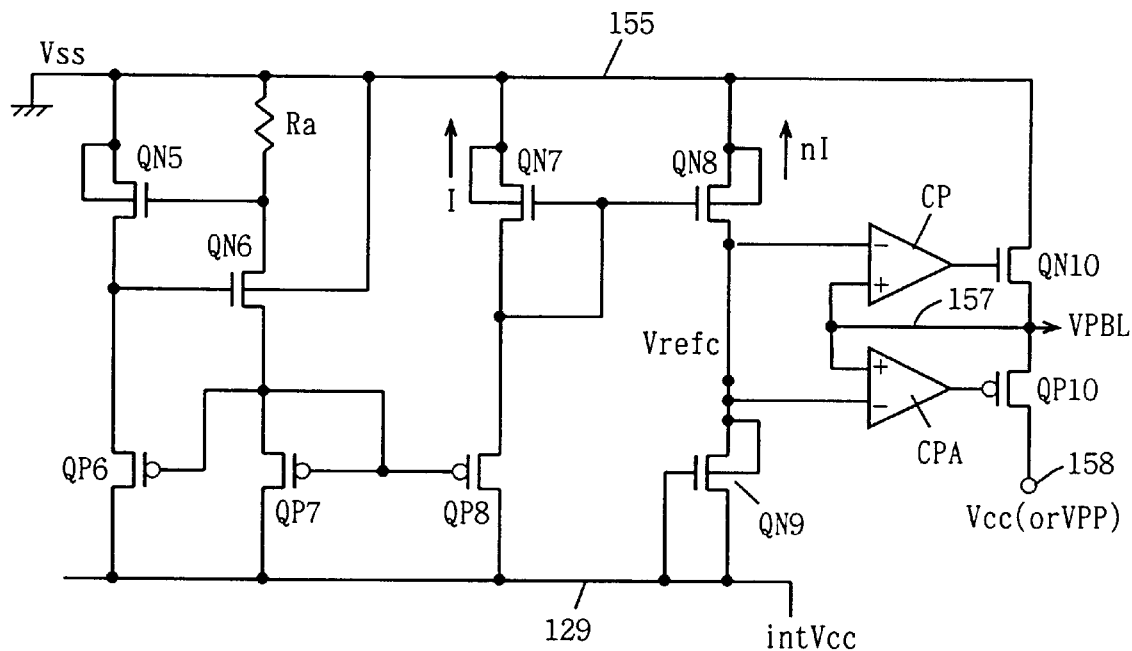
FIG. 19 illustrates the structure of a back gate voltage generation circuit for p-channel MOS transistors.

FIG. 19 illustrates the structure of a circuit generating the low-level back gate voltage VPBL for the p-channel MOS transistors. The low-level back gate voltage generation circuit shown in FIG. 19 is different from the circuit generating the low-level back gate voltage VNBL shown in FIG. 15 in the following points: A ground line 155 transmitting the ground voltage Vss is arranged in place of the negative voltage transmission line 135, the power supply line 129 transmitting the internal power supply voltage intVcc is provided in place of the ground line, a compare circuit CPA comparing the low-level back gate voltage VPBL from an output node 157 with a reference voltage Vrefc is provided, and a p-channel MOS transistor QP10 supplying a current in accordance with an output signal of the compare circuit CPA is provided between a node 158 and the output node 157. The node 158 is supplied with the power supply voltage Vcc or the high voltage VPP.

The remaining structure of this circuit is identical to that of the low-level back gate voltage generation circuit shown in FIG. 15, and corresponding portions are denoted by the same reference numerals, to omit the description thereof.

In the low-level back gate voltage generation circuit shown in FIG. 19, the reference voltage Vrefc, which is generated with reference to the internal power supply voltage intVcc, is expressed as follows:

$$V_{ref}C = -\sqrt{\frac{2n \cdot VTN}{\beta n9 \cdot Ra}} - VTN + intVcc$$

The reference voltages Vrefb and Vrefc for generating the high-level and low-level back gate voltages VPBH and VPBL-respectively are different in polarity from each other with reference to the internal power supply voltage intVcc, and the difference between the reference voltage Vrefc and the internal power supply voltage intVcc and that between the internal power supply voltage intVcc and the reference voltage Vrefb are substantially equal to each other.

A reference voltage generation circuit shown in FIG. 19 is different from that shown in FIG. 17 merely in the points that conductivity types of channels of MOS transistors are changed and that the ground voltage Vss is utilized in place of the high voltage VPP. Therefore, a required reference voltage can be precisely generated by mere replacement of the components of the circuit.

A compare circuit CP increases the conductance of an n-channel MOS transistor QN10 when the voltage VPBL from the output node 157 is higher than the reference voltage Vrefc, and reduces the level of the voltage VPBL. If the voltage VPBL from the output node 157 is higher than the reference voltage Vrefc, an output signal of the compare circuit CP goes low, and the MOS transistor QN10 enters a non-conducting state.

On the other hand, the compare circuit CPA outputs a high-level signal and brings the MOS transistor QP10 into a non-conducting state when the voltage VPBL is higher than the reference voltage Vrefc. If the voltage VPBL is lower than the reference voltage Vrefc, the level of an output signal of the compare circuit CPA is reduced to increase the conductance of the MOS transistor QP10, which in turn supplies a current from the node 158 and increases the level of the voltage VPBL.

Figure 20A:
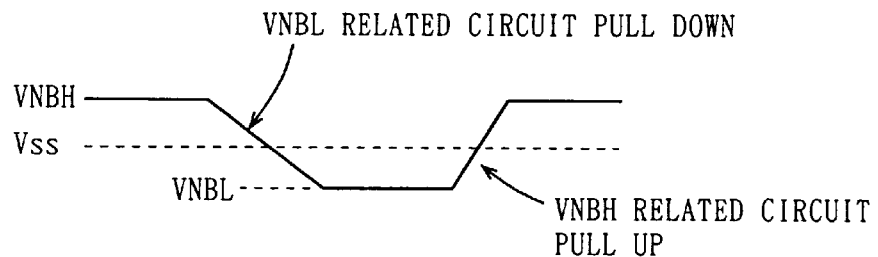
FIGS. 20A and 20B schematically illustrate a circuit operation in switching of the back gate voltage for n-channel MOS transistors.

As shown in FIG. 19, the voltage VPBL is pulled up or down by means of the compare circuits CP and CPA and the MOS transistors QN10 and QP10 for the following reason:

Consider a state that the back gate voltage VNB for the n-channel MOS transistors is supplied, as shown in FIG. 20A. If the back gate voltage VNB is changed from the high-level back gate voltage VNBH to the low-level back gate voltage VNBL, the voltage level of the back gate voltage VNB is pulled down to a prescribed level by the VNBL circuit generating the low-level back gate voltage VNBL, as clearly understood from the circuit structure shown in FIG. 15. Therefore, the back gate voltage VNB for the n-channel MOS transistors is reduced to the low-level back gate voltage VNBL level at a high speed. If the back gate voltage VNB is changed from the low-level back gate voltage VNBL to the high-level back gate voltage VNBH, the VNBH circuit generating the high-level back gate voltage VNBH operates to increase the voltage level supplied to the back gates of the MOS transistors to a prescribed high back gate voltage level at a high speed, as clearly understood from the circuit structure shown in FIG. 14.

Figure 20B:
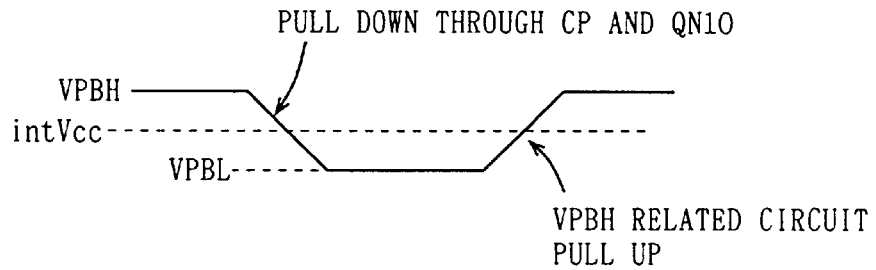

When the back gate voltage VPB for the p-channel MOS transistors is switched from the high-level back gate voltage VPBH to the low-level back gate voltage VPBL as shown in FIG. 20B, the back gate voltages of the target MOS transistors are higher than the low-level back gate voltage VPBL. In this state, the MOS transistor QP10 is in a non-conducting state while the MOS transistor QN10 conducts in accordance with the output signal of the compare circuit CP to discharge the high-level back gate voltage VPBH supplied to the substrate region and reduce its level to the prescribed low-level back gate voltage VPBL.

When the back gate voltage VPB is changed from the low-level back gate voltage VPBL to the high-level back gate voltage VPBH, the VPBH circuit generating the high-level back gate voltage VPBH operates to pull up the low-level back gate voltage VPBL in the substrate region to the prescribed high-level back gate voltage VPBH level at a high speed, as clearly understood from the circuit shown in FIG. 17. In the structure generating the back gate voltage for the p-channel MOS transistors, therefore, a circuit for pulling down and up the back gate voltage VPB is required, in order that the back gate voltage VPB can be switched at a high speed.

Also in the circuits generating the back gate voltages VPBH and VPBL for the p-channel MOS transistors, the back gate voltages VPBH and VPBL can be correctly set at prescribed reference voltage levels by employing feedback loops formed of comparing the back gate voltages with the reference voltage and adjusting the voltage levels in accordance with the results of the comparison. Thus, a constant back gate voltage VPB can be stably generated with no influence by the circuit operation or the like, and the threshold voltage of each p-channel MOS transistor can be correctly set at a desired value in response.

Modification of Reference Voltage Generation Circuit

Figure 21:
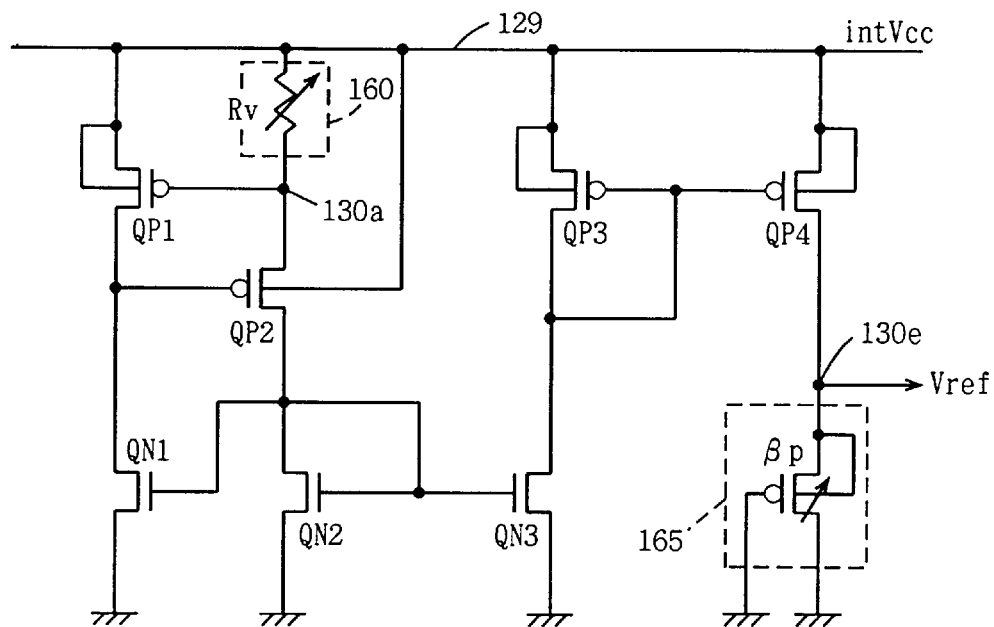
FIG. 21 illustrates an exemplary structure of a reference voltage generation circuit for generating the back gate voltage.

FIG. 21 illustrates the structure of a circuit generating the reference voltage Vref. The reference voltage generation circuit shown in FIG. 21 is different in structure from that shown in FIG. 14 in points that a variable resistive element 160 having a trimmable resistance value Rv replaces the resistive element R and that a current-to-voltage conversion element 165 having a trimmable transmission coefficient βp replaces the p-channel MOS transistor QP5, and the remaining structure of the former is identical to that of the latter. Hence, portions corresponding to those of the structure shown in FIG. 14 are denoted by the same reference numerals.

The resistance value Rv of the variable resistive element 160 and the transmission coefficient Op of the current-to-voltage conversion element 165 are trimmed as shown in FIG. 21, for adjusting the level of the reference voltage Vref generated at node 130e and correctly generating a required back gate voltage.

Figure 22A:
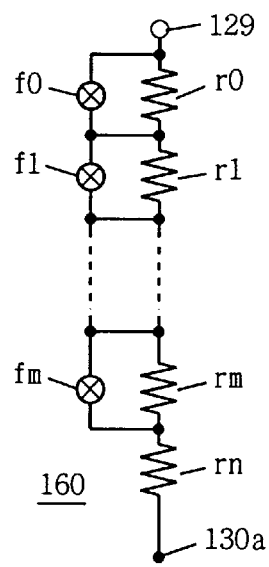
FIG. 22A illustrates an exemplary structure of a variable resistive element shown in FIG. 21.

FIG. 22A illustrates an exemplary structure of the variable resistive element 160 shown in FIG. 21. Referring to FIG. 22A, the variable resistive element 160 includes resistive elements r0 to rn serially connected between the power supply line 129 and the internal node 130a, and fusible link elements f0 to fm connected in parallel with the resistive elements r0 to rm respectively and serially connected with each other.

These link elements f0 to fm act as low-resistance elements when conductive, and resistance values thereof can be neglected as compared with those of the resistive elements r0 to rm. When all link elements f0 to fm are in conducting states in the variable resistive element 160, only the resistive element rn is connected between the power supply line 129 and the internal node 130a, with a resistance value rn. When the link elements f0 to fm are blown off with a laser beam, for example, an appropriate number of resistive elements are serially connected between the power supply line 129 and the resistive element rn, to increase the resistance value Rv of the variable resistive element 160. As clearly understood from the previous equation of the reference voltage Vref, the level of the reference voltage Vref is reduced when the resistance value Rv is increased.

Figure 22B:
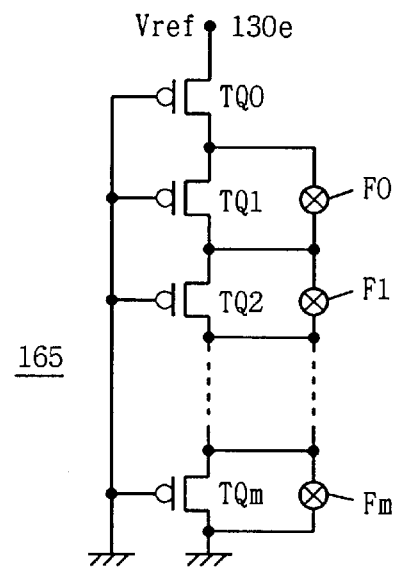
FIG. 22B illustrates an exemplary structure of a current-to-voltage conversion element shown in FIG. 21.

FIG. 22B illustrates an exemplary structure of the current-to-voltage conversion element 165 shown in FIG. 21. Referring to FIG. 22B, the current-to-voltage conversion element 165 includes p-channel MOS transistors TQ0 to TQm serially connected between the output node 130e and the ground node and having the gates thereof connected to the ground node, and fusible link elements F0 to Fm connected in parallel with the MOS transistors TQ1 to TQm and serially connected with each other. The link elements F0 to Fm act as low-resistance elements when conductive, to electrically short-circuit the corresponding p-channel MOS transistors.

When all link elements F0 to Fm are in conducting states in the current-to-voltage conversion element 165 shown in FIG. 22B, all MOS transistors TQ1 to TQm are short-circuited and the p-channel MOS transistor TQ0 is connected between the output node 130e and the ground node. When the link element F0 is blown off, the MOS transistors TQ0 and TQ1 are serially connected between the output node 130e and the ground node. Assuming that the sizes (the ratio of the gate width to the gate length) of all MOS transistors TQ0 to TQm are identical to each other, the gate length (channel length) is doubled and the transmission coefficient βp is halved in response. When an appropriate number of link elements F0 to Fm are fused out or blown off, the gate length (channel length) of a MOS transistor expressed by those connected between the output node 130e and the ground node is increased, and the transmission coefficient βp is reduced in response. When the transmission coefficient βp is reduced, the level of the reference voltage Vref is increased, as clearly understood from the previous equation.

Even if the reference voltage Vref is different from a prescribed voltage level due to factors such as manufacturing parameters, the reference voltage Vref of the optimum level can be generated by adjusting the reference voltage Vref in opposite directions in the variable resistive element 160 and the current-to-voltage conversion element 165 and appropriately fusing the link elements f0 to fm and F0 to Fm off.

The resistance value of the resistive element rn may be different from those of the resistive elements r0 to rm in FIG. 22A, while the size (the ratio of the channel width to the channel length) of the MOS transistor TQO may be different from those of the MOS transistors TQ1 to TQm in the current-to-voltage conversion element 165 shown in FIG. 22B. The reference voltage Vref of a designed value is generated by the resistive element rn and the MOS transistor TQ0, and a deviation between the actual reference voltage and the designed value is adjusted by the resistive elements r0 to rm and the MOS transistors TQ1 to TQm. Thus, the reference voltage Vref can be more precisely set, since a voltage step in adjustment can be narrowed.

The adjustment of the reference voltage Vref can be similarly applied to the circuit generating the high-level back gate voltage VPBH for the p-channel MOS transistors. In the circuit structure shown in FIG. 17, the resistive element R and the p-channel MOS transistor QP5 may be replaced with a variable resistive element and a current-to-voltage conversion element respectively.

Figure 23:
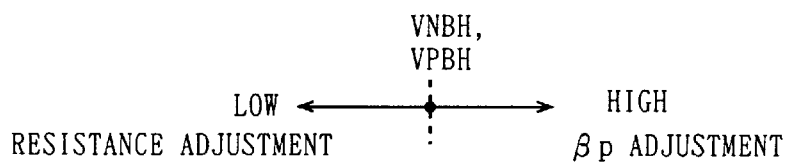
FIG. 23 illustrates a back gate voltage adjusting circuit in the variable resistive element and the current-to-voltage conversion element shown in FIG. 21.

When the transmission coefficient βp is reduced by adjusting the current-to-voltage conversion element, the reference voltage Vref is increased, and the back gate voltages VNBH and VPBH are increased in response, as shown in FIG. 23. When the resistance value of the variable resistive element is increased by trimming, the reference voltage Vref is reduced and the back gate voltages VNBH and VPBH are reduced in response. Thus, the back gate voltages VNBH and VPBH can be precisely set at desired voltage levels.

Reference Voltage Generation Circuit for Low-Level Back Gate Voltage

Figure 24:
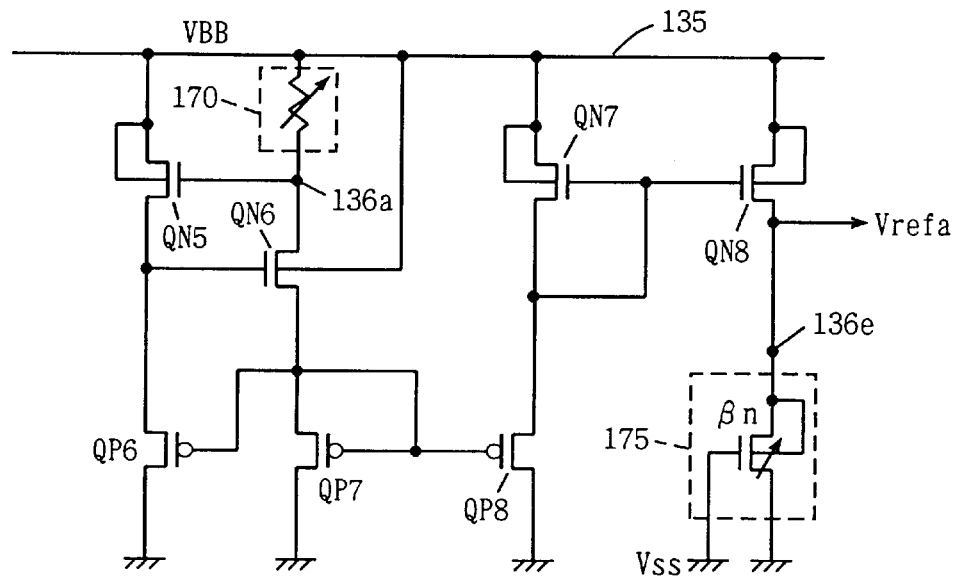
FIG. 24 illustrates another exemplary structure of the reference voltage generation circuit for a back gate voltage.

FIG. 24 illustrates the structure of a reference voltage generation circuit generating the reference voltage Vrefa for generating the low-level back gate voltage VNBL for the n-channel MOS transistors. The reference voltage generation circuit shown in FIG. 24 is different from that shown in FIG. 15 in the following points: The resistive element Ra for generating a constant current is replaced with a variable resistive element 170 having a trimmable resistance value, and the n-channel MOS transistor QN9 for generating the reference voltage Vrefa is replaced with a current-to-voltage conversion element 175 having a trimmable transmission coefficient βn. The remaining structure thereof is identical to that shown in FIG. 15, and corresponding portions are denoted by the same reference numerals. The current-to-voltage conversion element 175 is formed by n-channel MOS transistors, as shown in FIG. 25.

Figure 25:
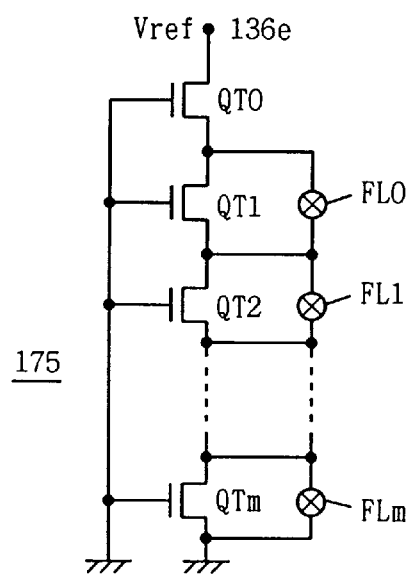
FIG. 25 illustrates an exemplary structure of a current-to-voltage conversion element shown in FIG. 24.

Referring to FIG. 25, the current-to-voltage conversion element 175 includes n-channel MOS transistors QT0 to QT1 serially connected between the internal node 136e and the ground node and having the gates thereof connected to the ground node, and fusible link elements FL0 to FLm connected with the MOS transistors QT1 to QTm in parallel with each other and serially connected with each other. The variable resistive element 170 is similar in structure to that shown in FIG. 22A.

In the structure shown in FIG. 24, the resistance value of the variable resistive element 170 is increased by fusing off a link element. In this case, a current flowing through the variable resistive element 170 is reduced, and the reference voltage Vrefa approaches the level of the ground voltage Vss in response.

When the link elements FL0 to FLm are appropriately fused off in the current-to-voltage conversion element 175 as shown in FIG. 25, the transmission coefficient On of the current-to-voltage conversion element 175 is reduced, leading to a large voltage drop thereacross. In this state, therefore, the level of the reference voltage Vrefa is reduced (becomes more negative).

The structures of the variable resistive element 170 and the current-to-voltage conversion element 175 shown in FIG. 24 can also be applied to the circuit for generating the low-level back gate voltage VPBL for the p-channel MOS transistors shown in FIG. 19.

Figure 26:
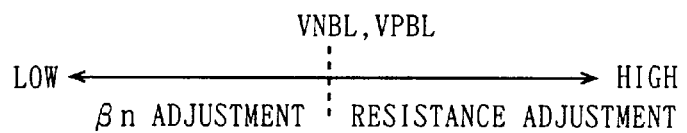
FIG. 26 illustrates an adjustment direction for the back gate voltage in a variable resistive element and the current-to-voltage conversion element shown in FIG. 24.

In the reference voltage adjustment for the low-level back gate voltages VNBL and VPBL, the levels of the low-level back gate voltages VNBL and VPBL are increased when the resistance value of the variable resistive element 170 is increased by fusing off the link elements, while they are reduced following reduction of the level of the reference voltage Vrefa when the transmission coefficient βn is adjusted by fusing off the link elements FL0 to FLm in the current-to-voltage conversion element 175, as shown in FIG. 26. Thus, the back gate voltages VNBL and VPBL can be set at desired voltage levels by adjusting the reference voltage Vrefa.

As hereinabove described, the reference voltage generation circuit for generating the back gate voltages is provided with the trimming circuits for adjusting the reference voltage level, whereby a reference voltage of a desired voltage level is reliably generated so that back gate voltages of desired voltage levels can be generated in response and variation in threshold voltage can be suppressed even if the reference voltage is deviated from the designed value due to variation of manufacturing parameters or the like.

The resistive element may be provided with a series body of a resistive element and a link element in parallel with each other, and the current-to-voltage conversion element may also be provided with a series body of an MOS transistor and a link element in parallel with each other.

Modifications

The above description is made with reference to a semiconductor memory device in which the voltage level of a selected word line is increased beyond the internal power supply voltage as the semiconductor integrated circuit device. However, the structure of applying back gate voltages of different polarity and equal absolute values with reference to the source potentials of the MOS transistors is applicable to any semiconductor integrated circuit device so far as the same has standby and active cycles. The MOS transistors forming the semiconductor integrated circuit can be guaranteed of reliability, and the back gate voltages can be generated by simply inverting the conductivity types of the channels of the MOS transistors and the voltages in the circuit structures for generating the back gate voltages, whereby the back gate voltages can be readily generated.

The sum of the absolute value of each low-level back gate voltage and the power supply voltage has only to be at a level of substantially 3/2 times the power supply voltage, and the internal power supply voltage, and the absolute value of the low-level back gate voltage with reference to the source potential may not be restricted to 1.0 V and 0.55 or 0.5 V in particular.

According to the present invention, as hereinabove described, the voltages applied to the back gates of the MOS transistors are different in polarity from each other with reference to the source potential, whereby the voltages applied between the gates and the sources/drains of the MOS transistors can be reduced and reliability of the gate insulating films can be ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device operating with first and second power supply voltages as operating power supply voltages, comprising:

a plurality of memory cells arranged in rows and columns and formed on a substrate region of a first conductivity type;

a plurality of word lines arranged in correspondence to the respective rows and having memory cells of corresponding rows connected thereto respectively;

row selection means for transmitting a driving voltage larger in absolute value than said first power supply voltage to a word line corresponding to an addressed row out of said rows in accordance with an address signal; and bias application means for applying a bias voltage to said substrate region;

said bias application means including means applying a first bias voltage to said substrate region in an active cycle in which said address signal is made valid and a memory cell selecting operation is performed while applying a second bias voltage different in polarity from said first bias voltage with reference to said second power supply voltage in a standby cycle in which said row selection means is held in an inactive state, the absolute value of the difference between said second bias voltage and said first power supply voltage being substantially equal to that of the difference between said driving voltage and said second power supply voltage.

2. The semiconductor integrated circuit device in accordance with claim 1, wherein the absolute value of the difference between said first bias voltage and said second power supply voltage is substantially equal to that of the difference between said second bias voltage and said second power supply voltage.

3. The semiconductor integrated circuit device in accordance with claim 1, further including level adjusting means for adjusting the levels of said first and second bias voltages.

4. The semiconductor integrated circuit device in accordance with claim 1, wherein said bias application means includes:

reference voltage generation means for generating a first reference voltage corresponding to said first bias voltage, an output node outputting said first bias voltage, compare means comparing a voltage corresponding to the voltage at said output node with said first reference voltage, and means for supplying charges to said output node to adjust the voltage level of said output node in accordance with an output signal of said compare means.

5. The semiconductor integrated circuit device in accordance with claim 1, further comprising:

a peripheral insulated gate field-effect transistor formed on a second conductivity type substrate region and performing a prescribed function when activated, and second bias application means for applying a third bias voltage to said second conductivity type substrate region in said active cycle while applying a fourth bias voltage in said standby cycle, said third and fourth bias voltages being different in polarity from each other with reference to said first power supply voltage.

6. The semiconductor integrated circuit device in accordance with claim 5, wherein an arithmetic mean of said third and fourth bias voltages are substantially equal to said first power supply voltage.

7. The semiconductor integrated circuit device in accordance with claim 5, wherein the ratio of said driving voltage to said first power supply voltage is substantially equal to the ratio of said fourth bias voltage to said first power supply voltage.

8. A semiconductor integrated circuit device comprising:

an internal circuit including an insulated gate field-effect transistor formed on a first conductivity type semiconductor substrate region having a source coupled to receive a first reference voltage, for executing a prescribed function when activated; and bias application means for applying a first bias voltage to the substrate region in activation of said internal circuit while applying a second bias voltage being different in polarity from said first bias voltage with reference to said first reference voltage in inactivation of said internal circuit in accordance with an operating mode instructing signal instructing an active and inactive state of said internal circuit, an arithmetic mean of said first and second bias voltages being substantially equal to said first reference voltage.

9. The semiconductor integrated circuit device in accordance with claim 8, further including level adjusting means for adjusting the levels of said first and second bias voltages.

10. The semiconductor integrated circuit device in accordance with claim 8, wherein said bias application means includes:

reference voltage generation means for generating a second reference voltage corresponding to said first bias voltage, an output node outputting said first bias voltage, compare means for comparing a voltage corresponding to the voltage at said output node with said second reference voltage, and means for supplying charges to said output node and adjusting the voltage level of said output node in accordance with an output signal of said compare means.

11. A semiconductor integrated circuit device operating with first and second power supply voltages as operating power supply voltages, comprising:

a plurality of memory cells arranged in rows and columns;

a plurality of word lines arranged in correspondence to the respective rows and having the memory cells of corresponding rows connected thereto and receiving a driving voltage larger in absolute value than said first power supply voltage when selected;

a peripheral circuit including an insulated gate field-effect transistor formed on a first conductivity type substrate region and performing a prescribed operation when activated; and bias application means for applying a bias voltage to the substrate region;

said bias application means including means for applying a first bias voltage to said substrate region in activation of said peripheral circuit while applying a second bias voltage being different in polarity from said first bias voltage with reference to said second power supply voltage in inactivation of said peripheral circuit in accordance with an operating mode instructing signal instructing activation and inactivation of said peripheral circuit, the absolute value of the difference between said second bias voltage and said first power supply voltage being substantially equal to that of the difference between said driving voltage and said second power supply voltage.

12. The semiconductor integrated circuit device in accordance with claim 11, wherein the absolute value of the difference between said first bias voltage and said second power supply voltage is substantially equal to that of the difference between said second bias voltage and said second power supply voltage.

13. The semiconductor integrated circuit device in accordance with claim 11, further including level adjusting means for adjusting the levels of said first and second bias voltages.

14. The semiconductor integrated circuit device in accordance with claim 11, wherein said bias application means includes:

reference voltage generation means for generating a first reference voltage corresponding to said first bias voltage, an output node outputting said first bias voltage, compare means for comparing a voltage corresponding to the voltage of said output node with said first reference voltage, and means for supplying charges to said output node and adjusting the voltage level of said output node in accordance with an output signal of said compare means.

15. The semiconductor integrated circuit device in accordance with claim 11, further comprising:

a peripheral insulated gate field-effect transistor formed on a second conductivity type substrate region, included in said peripheral circuit and performing a prescribed function when activated, and second bias application means applying a third bias voltage to said second conductivity type substrate region in an active cycle of said peripheral circuit while applying a fourth bias voltage in a standby cycle of said peripheral circuit, said third and fourth bias voltages being different in polarity from each other with reference to said first power supply voltage.

16. A semiconductor integrated circuit device operating with first and second power supply voltages as operating power supply voltages, comprising:

a plurality of memory cells arranged in rows and columns;

a plurality of word lines arranged in correspondence to the respective rows and having the memory cells of corresponding rows connected thereto and receiving a driving voltage larger in absolute value than said first power supply voltage when selected;

a peripheral circuit including an insulated gate field-effect transistor formed on a substrate region, for performing a prescribed operation when activated; and bias application means for applying a bias voltage to said substrate region;

said bias application means including means for applying a first bias voltage to said substrate region in activation of said peripheral circuit while applying a second bias voltage being different in polarity from said first bias voltage with reference to said first power supply voltage in inactivation of said peripheral circuit in accordance with an operating mode instructing signal instructing activation and inactivation of said peripheral circuit, the absolute value of the difference between said second bias voltage and said second power supply voltage being substantially equal to that of the difference between said driving voltage and said second power supply voltage.

17. The semiconductor integrated circuit device in accordance with claim 16, wherein the absolute value of the difference between said first bias voltage and said second power supply voltage is substantially equal to that of the difference between said second bias voltage and said second power supply voltage.

18. The semiconductor integrated circuit device in accordance with claim 16, further including level adjusting means for adjusting the levels of said first and second bias voltages.

19. The semiconductor integrated circuit device in accordance with claim 16, wherein said bias application means includes:

reference voltage generation means for generating a first reference voltage corresponding to said first bias voltage, an output node outputting said first bias voltage, compare means for comparing a voltage corresponding to the voltage at said output node with said first reference voltage, and means for supplying charges to said output node and adjusting the voltage level of said output node in accordance with an output signal of said compare means.

20. The semiconductor integrated circuit device in accordance with claim 16, further comprising:

a peripheral insulated gate field-effect transistor formed on a second conductivity type substrate region and performing a prescribed function when activated, and second bias application means applying a third bias voltage to said second conductivity type substrate region in an active cycle of said peripheral circuit while applying a fourth bias voltage in a standby cycle of said peripheral circuit, said third and fourth bias voltages being different in polarity from each other with reference to said first power supply voltage, said peripheral insulated gate field-effect transistor included in said peripheral circuit.

* * * * *